(12) United States Patent
Okazaki et al.

(10) Patent No.: US 11,871,600 B2
(45) Date of Patent: Jan. 9, 2024

(54) DISPLAY DEVICE

(71) Applicant: Semiconductor Energy Laboratory Co., Ltd., Kanagawa-ken (JP)

(72) Inventors: Kenichi Okazaki, Tochigi (JP); Shingo Eguchi, Kanagawa (JP); Hiroki Adachi, Tochigi (JP)

(73) Assignee: Semiconductor Energy Laboratory Co., Ltd.

( * ) Notice: Subject to any disclaimer, the term of this patent is extended or adjusted under 35 U.S.C. 154(b) by 156 days.

(21) Appl. No.: 17/581,064

(22) Filed: Jan. 21, 2022

(65) Prior Publication Data
US 2022/0238836 A1 Jul. 28, 2022

(30) Foreign Application Priority Data
Jan. 27, 2021 (JP) .................................. 2021-011450

(51) Int. Cl.
*H01L 51/50* (2006.01)
*H10K 50/822* (2023.01)
*H10K 50/13* (2023.01)
*H10K 102/00* (2023.01)

(52) U.S. Cl.
CPC ........... *H10K 50/822* (2023.02); *H10K 50/13* (2023.02); *H10K 2102/341* (2023.02)

(58) Field of Classification Search
CPC . H10K 50/822; H10K 50/13; H10K 2102/341
See application file for complete search history.

(56) References Cited

U.S. PATENT DOCUMENTS

| | | |
|---|---|---|
| 5,953,985 A | 9/1999 | Kobayashi |
| 6,120,338 A | 9/2000 | Hirano et al. |
| 2002/0072139 A1 | 6/2002 | Kashiwabara |
| 2011/0148290 A1 | 6/2011 | Oota |
| 2012/0256204 A1 | 10/2012 | Yoshizumi et al. |
| 2012/0273804 A1 | 11/2012 | Hatano |
| 2012/0276484 A1 | 11/2012 | Izumi et al. |
| 2013/0084531 A1 | 4/2013 | Hamaguchi et al. |
| 2013/0084664 A1 | 4/2013 | Yoshitoku et al. |
| 2013/0084666 A1 | 4/2013 | Oshige |
| 2013/0280839 A1 | 10/2013 | Sonoda et al. |
| 2013/0295705 A1 | 11/2013 | Sonoda et al. |

(Continued)

FOREIGN PATENT DOCUMENTS

| | | |
|---|---|---|
| JP | 2000-036385 A | 2/2000 |
| JP | 2002-324673 A | 11/2002 |

(Continued)

OTHER PUBLICATIONS

Zakhidov, A. et al., "Orthogonal Processing: A new Strategy for Organic Electronics," Chemical Science, Apr. 7, 2011, vol. 2, No. 6, pp. 1178-1182.

(Continued)

*Primary Examiner* — Anthony Ho
(74) *Attorney, Agent, or Firm* — Husch Blackwell LLP

(57) ABSTRACT

A display device with high display quality is provided. The display device includes a first lower electrode, a first EL layer over the first lower electrode, a second lower electrode, a second EL layer over the second lower electrode, an upper electrode over the first EL layer and the second EL layer, a first region not provided with the first lower electrode below the first EL layer, and a second region not provided with the second lower electrode below the second EL layer. In the first region, the upper electrode is positioned not to be in contact with the first lower electrode. In the second region, the upper electrode is positioned not to be in contact with the second lower electrode.

7 Claims, 23 Drawing Sheets

(56) References Cited

U.S. PATENT DOCUMENTS

| | | | |
|---|---|---|---|
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2020/0203662 | A1 | 6/2020 | Mollard et al. |

FOREIGN PATENT DOCUMENTS

| | | |
|---|---|---|
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| WO | WO 2018/087625 A1 | 5/2018 |

OTHER PUBLICATIONS

Malinowski, P. et al., "High Resolution Photolithography for Direct View Active Matrix Organic Light-Emitting Diode Augmented Reality Displays," Journal of the Society for Information Display, Apr. 2, 2018, vol. 26, No. 3, pp. 128-136.

Malinowski, P. et al., "Photolithographic Patterning of Organic Photodetectors with a Non-Fluorinated Photoresist System," Organic Electronics, Jul. 12, 2014, vol. 15, No. 10, pp. 2355-2359.

Malinowski, P. et al., "Multicolor 1250 ppi OLED Arrays Patterened by Photolithography," SID Digest '16: SID International Symposium Digest of Technical Papers, May 22, 2016, vol. 47, No. 1, pp. 1009-1012.

Papadopoulous, N. et al., "AMOLED Displays with In-Pixel Photodetector," Liquid Crystals and Display Technology, Jul. 9, 2020, pp. 1-19.

Ke, T. et al., "Technology Developments in High-Resolution FMM-free OLED and BEOL IGZO TFTs for Power-Efficient Microdisplays," SID Digest '21: SID International Symposium Digest of Technical Papers, May 1, 2021, vol. 52, No. 1, pp. 127-130.

Malinowski, P. et al., "Integration of Additional Functionalities into the Frontplane of AMOLED Displays," SID Digest '20: SID International Symposium Digest of Technical Papers, Aug. 1, 2020, vol. 51, No. 1, pp. 646-649.

Malinowski, P. et al., "Organic Photolithography for Displays with Integrated Fingerprint Scanner," SID Digest '19: SID International Symposium Digest of Technical Papers, May 29, 2019, vol. 50, No. 1, pp. 1007-1010.

Ke, T. et al., "Island and Hole Fabrication on OLED Stack for High-Resolution Sensor in Display Application", IDW '20: Proceedings of the 27th International Display Workshops, Dec. 9, 2020, vol. 27, pp. 902-905.

Gather, M. et al., "Solution-Processed Full-Color Polymer-OLED Displays Fabricated by Direct Photolithography," SID Digest '06: SID International Symposium Digest of Technical Papers, Jun. 1, 2006, vol. 37, No. 1, pp. 909-911.

Malinowski, P. et al., "Photolithography as Enabler of AMOLED Displays Beyond 1000 ppi," SID Digest '17: SID International Symposium Digest of Technical Papers, May 1, 2017, vol. 48, No. 1, pp. 623-626.

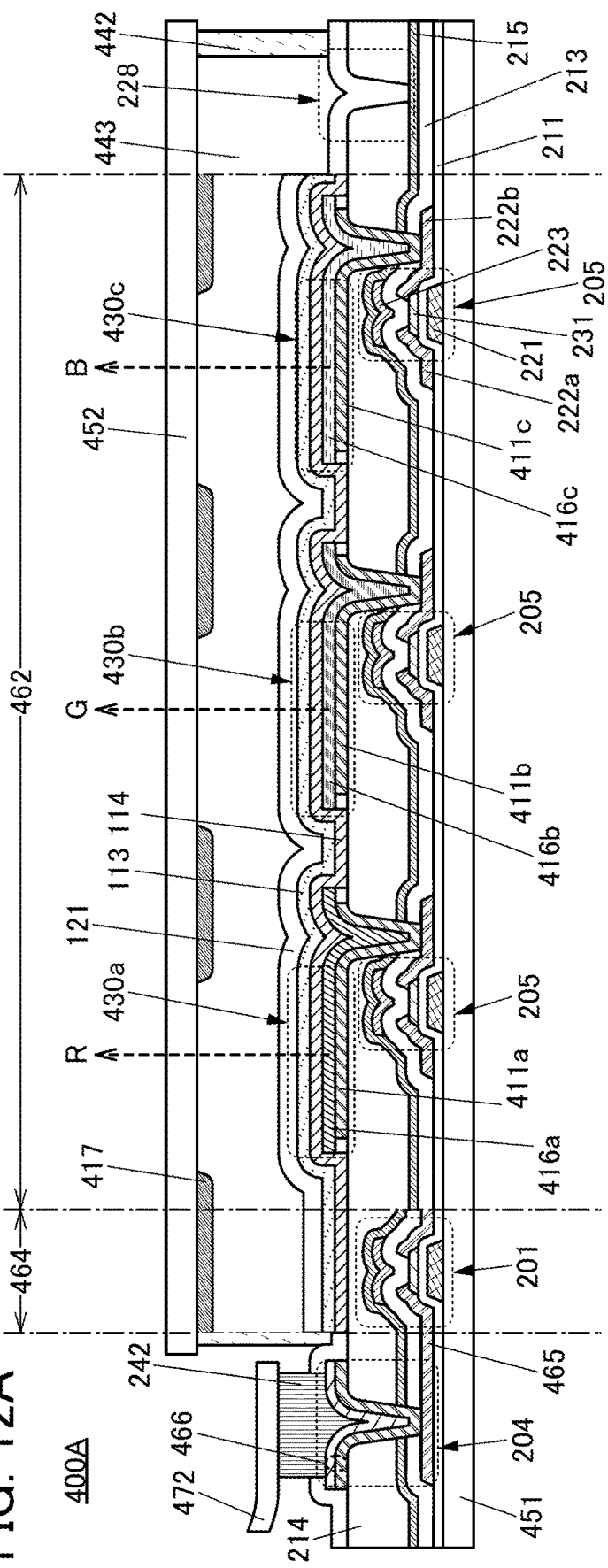
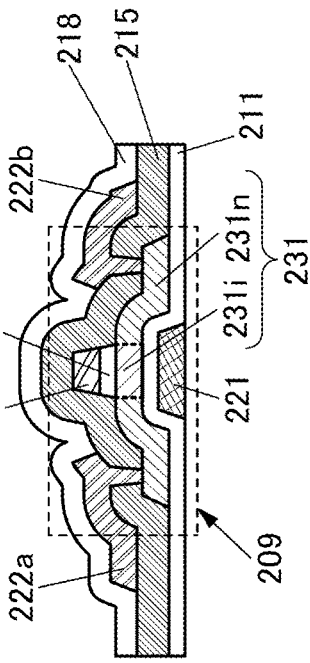
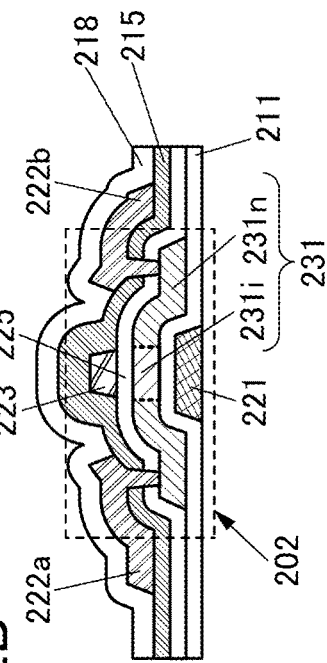
FIG. 12A
FIG. 12B
FIG. 12C

DISPLAY DEVICE

BACKGROUND OF THE INVENTION

1. Field of the Invention

One embodiment of the present invention relates to a display device. One embodiment of the present invention relates to a method for manufacturing a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to a device that can function by utilizing semiconductor characteristics in general.

2. Description of the Related Art

In recent years, higher definition display panels have been demanded. Examples of devices that require high-definition display panels include a smartphone, a tablet terminal, and a laptop computer. Furthermore, higher definition has been required for a stationary display device such as a television device or a monitor device along with an increase in resolution. A device absolutely required to have a high-definition display panel is a device for virtual reality (VR) or augmented reality (AR).

Examples of the display device that can be used for a display panel include, typically, a liquid crystal display device, a light-emitting apparatus including a light-emitting element such as an organic electroluminescent (EL) element or a light-emitting diode (LED), and electronic paper performing display by an electrophoretic method or the like.

For example, an organic EL element basically has such a structure that a layer containing a light-emitting organic compound is provided between a pair of electrodes. By voltage application to this element, the light-emitting organic compound can emit light. A display device containing such an organic EL element needs no backlight which is necessary for a liquid crystal display device and the like and thus can have advantages such as thinness, lightweight, high contrast, and low power consumption. Patent Document 1, for example, discloses an example of a display device using an organic EL element.

Patent Document 2 discloses a display device using an organic EL device for VR.

REFERENCE

Patent Document

[Patent Document 1] Japanese Published Patent Application No. 2002-324673
[Patent Document 2] PCT International Publication No. 2018/087625

SUMMARY OF THE INVENTION

An object of one embodiment of the present invention is to provide a display device with high display quality. An object of one embodiment of the present invention is to provide a highly reliable display device. An object of one embodiment of the present invention is to provide a display device with low power consumption. An object of one embodiment of the present invention is to provide a display device that can easily achieve higher definition. An object of one embodiment of the present invention is to provide a display device with high display quality and high definition. An object of one embodiment of the present invention is to provide a display device with high contrast.

Another object of one embodiment of the present invention is to provide a display device with a novel structure or a method for manufacturing the display device. An object of one embodiment of the present invention is to provide a method for manufacturing the above display device with high yield. An object of one embodiment of the present invention is to alleviate at least one of problems of the conventional technique.

Note that the description of these objects does not preclude the existence of other objects. In one embodiment of the present invention, there is no need to achieve all these objects. Objects other than these can be derived from the description of the specification, the drawings, the claims, and the like.

One embodiment of the present invention is a display device including a first lower electrode, a first EL layer over the first lower electrode, a second lower electrode, a second EL layer over the second lower electrode, and an upper electrode over the first EL layer and the second EL layer. In addition, a first region where the first lower electrode is not provided is included below the first EL layer, and a second region where the second lower electrode is not provided is included below the second EL layer. In the first layer, the upper electrode is positioned not to be in contact with the first lower electrode. In the second region, the upper electrode is positioned not to be in contact with the second lower electrode.

Another embodiment of the present invention is a display device including a first lower electrode, a first EL layer over the first lower electrode, a second lower electrode, a second EL layer over the second lower electrode, and an upper electrode over the first EL layer and the second EL layer. The upper electrode is positioned to be apart from the first lower electrode in a first region below the first EL layer; and the upper electrode is positioned to be apart from the second lower electrode in a second region below the second EL layer.

Another embodiment of the present invention is a display device where the upper electrode in the first region includes a region overlapping with the first EL layer.

Another embodiment of the present invention is a display device including a common layer between the first EL layer and the upper electrode and between the second EL layer and the upper electrode.

Another embodiment of the present invention is a method for manufacturing a display device, which includes a step of forming a conductive film, a step of forming an EL film over the conductive film, a step of forming a sacrificial film over the EL film, a step of forming a protective film over the sacrificial film, a step of forming a resist over the protective film, a step of forming a stack of an EL layer, a sacrificial layer, and a protective layer with use of the resist as a mask, a step of forming a lower electrode with use of the stack as a mask, a step of removing the protective layer and the sacrificial layer, and a step of forming an upper electrode over the EL layer. The upper electrode is positioned to be apart from the lower electrode in a region below the EL layer.

Another embodiment of the present invention may be a light-emitting apparatus without a display function. Another embodiment of the present invention may be a photoelectric conversion device including a photoelectric conversion element such as a sensor.

According to one embodiment of the present invention, a display device with high display quality can be provided. Moreover, a highly reliable display device can be provided. Moreover, a display device with low power consumption can be provided. Moreover, a display device that can easily achieve higher definition can be provided. Moreover, a display device having high display quality and high definition can be provided. Moreover, a display device with high contrast can be provided.

According to another embodiment of the present invention, a display device with a novel structure or a method for manufacturing the display device can be provided. Moreover, a method for manufacturing the above display device with high yield can be provided. According to one embodiment of the present invention, at least one of problems of the conventional technique can be alleviated.

Note that the description of these effects does not preclude the existence of other effects. One embodiment of the present invention does not necessarily have all these effects. Effects other than these can be derived from the description of the specification, the drawings, the claims, and the like.

BRIEF DESCRIPTION OF THE DRAWINGS

FIG. 12A is a cross-sectional view illustrating an example of a display device.

FIGS. 12B and 12C are cross-sectional views each illustrating an example of a transistor.

DETAILED DESCRIPTION OF THE INVENTION

Figure 1A:
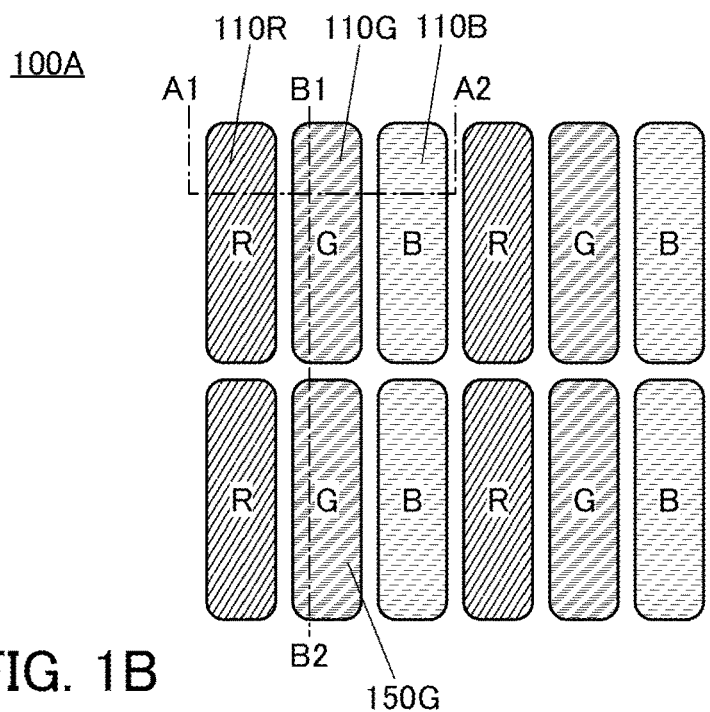
FIGS. 1A to 1C illustrate a structure example of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number of components.

In this specification and the like, the terms "film" and "layer" can be interchanged with each other. For example, in some cases, the terms "conductive layer" and "insulating layer" can be changed into "conductive film" and "insulating film", respectively.

Note that in this specification, an EL layer means a layer containing at least a light-emitting substance (also referred to as a light-emitting layer) or a stack including the light-emitting layer provided between a pair of electrodes of a light-emitting element.

In this specification and the like, a display panel that is one embodiment of a display device has a function of displaying (outputting) an image or the like on (to) a display surface. Thus, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

A light-emitting element of one embodiment of the present invention may include layers containing a substance with a high hole-injection property, a substance with a high hole-transport property, a substance with a high electron-transport property, a substance with a high electron-injection property, a substance with a bipolar property, and the like.

Note that the aforementioned layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dots can function as a light-emitting material.

The quantum dot material can be a colloidal quantum dot material, an alloyed quantum dot material, a core-shell quantum dot material, a core quantum dot material, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers in light-emitting devices of different colors (here, blue (B), green (G), and red (R)) are separately formed or separately patterned may be referred to as a side-by-side (SBS) structure. In this specification and the like, a light-emitting device capable of emitting white light may be referred to as a white light-emitting device. Note that a white light-emitting device that is combined with coloring layers (e.g., color filters) can be a light-emitting device of full-color display.

Structures of light-emitting devices can be classified roughly into a single structure and a tandem structure. A light-emitting device with a single structure includes one light-emitting unit between a pair of electrodes, and the light-emitting unit preferably includes one or more light-emitting layers. To obtain white light emission, two or more light-emitting layers that emit light of complementary colors are selected. For example, when emission colors of a first light-emitting layer and a second light-emitting layer are complementary colors, a light-emitting device can be configured to emit white light as a whole. The same applies to a light-emitting device including three or more light-emitting layers.

A light-emitting device with a tandem structure includes two or more light-emitting units between a pair of electrode, and each light-emitting unit preferably includes one or more light-emitting layers. To obtain white light emission, the structure is made so that light from light-emitting layers of the light-emitting units can be combined to be white light. Note that a structure for obtaining white light emission is similar to that in the case of a single structure. In the light-emitting device with a tandem structure, it is preferable that an intermediate layer such as a charge-generation layer be provided between the plurality of light-emitting units.

When the white light-emitting device (having a single structure or a tandem structure) and a light-emitting device having an SBS structure are compared to each other, the latter can have lower power consumption than the former. To reduce power consumption, a light-emitting device having an SBS structure is preferably used. Meanwhile, the white light-emitting device is preferable in terms of lower manufacturing cost or higher manufacturing yield because the manufacturing process of the white light-emitting device is simpler than that of a light-emitting device having an SBS structure.

Embodiment 1

In this embodiment, a structure example of a display device of one embodiment of the present invention and a method for manufacturing the display device will be described.

One embodiment of the present invention is a display device including a light-emitting element (also referred to as a light-emitting device). The display device includes at least two light-emitting elements which emit light of different colors. The light-emitting elements each include a pair of electrodes and an EL layer therebetween. As the light-emitting element, an electroluminescence element such as an organic EL element or an inorganic EL element can be used. Besides, a light-emitting diode (LED) can be used. The light-emitting element of one embodiment of the present invention is preferably an organic electroluminescence element (organic EL element). The two or more light-emitting elements emitting different colors include respective EL layers containing different materials. For example, three kinds of light-emitting elements emitting red (R), green (G), and blue (B) light are included, whereby a full-color display device can be achieved.

As a way of forming EL layers separately between light-emitting elements of different colors, an evaporation method using a shadow mask such as a metal mask is known. However, this method causes a deviation from the designed shape and position of an island-shaped organic film due to various influences such as the low accuracy of the metal mask position, the positional deviation between the metal mask and a substrate, a warp of the metal mask, and the vapor-scattering-induced expansion of outline of the deposited film; accordingly, it is difficult to achieve high definition and high aperture ratio of the display device. In addition, dust derived from a material attached to the metal mask in evaporation is generated in some cases. Such dust might cause defective patterning of the light-emitting element. In addition, a short circuit derived from the dust may occur. A cleaning step for removing the material attached to the metal mask is necessary. Thus, a measure has been taken for pseudo improvement in definition (also referred to pixel density). As a specific measure, a unique pixel arrangement such as a PenTile pattern has been employed.

In one embodiment of the present invention, fine patterning of an EL layer is performed without a shadow mask such as a metal mask. With the patterning, a high-definition display device with a high aperture ratio, which had been difficult to achieve, can be fabricated. Moreover, EL layers can be formed separately, which enables extremely clear images; thus, a display device with a high contrast and high display quality can be fabricated.

Here, a description is made on a case where EL layers in light-emitting elements of two colors are separately formed, for simplicity. First, a stack of a conductive film to be a pixel electrode (also referred to as lower electrode), a first EL film, and a first sacrificial film is formed. Next, a resist mask is formed over the first sacrificial film. Then, part of the first sacrificial film and part of the first EL film are etched using the resist mask, so that the first EL layer and a first sacrificial layer over the first EL layer are formed.

Next, a stack of a second EL film and a second sacrificial film is formed. Then, part of the second sacrificial film and part of the second EL film are etched using the resist mask, so that a second EL layer and a second sacrificial layer over the second EL layer are formed. Next, the pixel electrode is processed using the first sacrificial layer and the second sacrificial layer as a mask, so that a first pixel electrode overlapping with the first EL layer and a second pixel electrode overlapping with the second EL layer are formed. In this manner, the first EL layer and the second EL layer can be formed separately. Finally, the first sacrificial layer and second sacrificial layer are removed, and a common electrode (also referred to as upper electrode) is formed, whereby light-emitting elements of two colors can be formed separately.

Furthermore, by repeating the above-described steps, EL layers in light-emitting elements of three or more colors can be separately formed. Accordingly, a display device including light-emitting elements of three or more colors can be achieved.

In the case where an end portion of the pixel electrode is substantially aligned with an end portion of the EL layer and the case where the end portion of the pixel electrode is positioned on an outer side than the end portion of the EL layer, the common electrode and the pixel electrode are sometimes short-circuited when the common electrode is formed over the EL layer.

Thus, the display device of one embodiment of the present invention employs such a structure that a region without the pixel electrode is provided below the end portion of the EL layer, and the common electrode is positioned not to be in contact with the pixel electrode in the region. The common electrode and the pixel electrode are not electrically connected to each other as in the above manner, whereby a short circuit between the pixel electrode and the common electrode can be inhibited.

Moreover, in one embodiment of the present invention, the sacrificial layer is formed using a resist mask (also referred to as resist or photoresist), and the EL layer and the pixel electrode can be processed using the formed sacrificial layer. This means that a light-emitting element can be formed without use of different resist masks for processing the pixel electrode and processing of the EL layer. Thus, a margin between the end portions of the pixel electrode and the EL layer is not necessarily provided for forming a light-emitting element. With a reduction in the margin between the end portions, a light-emitting region can be extended, whereby the aperture ratio of the light-emitting element can be increased. Moreover, with a reduction in the margin between the end portions, a reduction in the pixel size is possible, whereby the display device can have higher definition. Furthermore, the number of uses of the resist masks can be reduced, whereby the process can be simplified. This enables a reduction in cost and an improvement in yield.

In the case where EL layers for different colors are adjacent to each other, it is difficult to set the distance between the EL layers adjacent to each other to be less than 10 μm with a formation method using a metal mask, for example. In contrast, with use of the above method in one embodiment of the present invention, the distance can be decreased to be less than or equal to 3 μm, less than or equal to 2 μm, or less than or equal to 1 μm. For example, with use of an exposure tool for LSI, the distance can be decreased to be less than or equal to 500 nm, less than or equal to 200 nm, less than or equal to 100 nm, or less than or equal to 50 nm. Accordingly, the area of a non-light-emitting region exiting between two light-emitting elements can be significantly reduced, and the aperture ratio can be close to 100%. For example, the aperture ratio may be higher than or equal to 50%, higher than or equal to 60%, higher than or equal to 70%, higher than or equal to 80%, or higher than or equal to 90%; that is, the aperture ratio lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the whole pattern area. In contrast, in the manufacturing method of one embodiment of the present invention, a pattern is formed by processing a film deposited to have a uniform thickness, which enables a uniform thickness in the pattern. Thus, even in the fine pattern, almost the whole area can be used as a light-emitting region. Therefore, the above method makes it possible to obtain a high resolution display device with a high aperture ratio.

As described above, the above fabrication method enables a display device in which minute light-emitting elements are integrated; accordingly, it is not necessary to employ a unique pixel arrangement such as a PenTile pattern for pseudo improvement in the definition degree. Therefore, it is possible to achieve a display device employing what is called a stripe arrangement in which R, G, and B pixels are arranged in one direction and having definition higher than or equal to 500 ppi, higher than or equal to 1000 ppi, higher than or equal to 2000 ppi, higher than or equal to 3000 ppi, or higher than or equal to 5000 ppi.

Specific structure examples, fabrication method examples, and the like of the display device of one embodiment of the present invention are described below with reference to drawings.

Structure Example 1 of Display Device

FIG. 1A is a schematic top view of a display device 100A of one embodiment of the present invention. The display device 100A includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A shows what is called a stripe arrangement, in which the light-emitting elements of the same color are arranged in one direction. Note that the arrangement of the light-emitting elements is not limited thereto; another arrangement such as a delta, zigzag, or PenTile pattern may also be used.

As each of the light-emitting elements 110R, 110G, and 110B, an EL element such as an organic light-emitting diode (OLED) or a quantum-dot light-emitting diode (QLED) is preferably used. Examples of a light-emitting substance included in the EL element include a substance exhibiting fluorescence (fluorescent material), a substance exhibiting phosphorescence (phosphorescent material), an inorganic compound (e.g., quantum dot material), and a substance exhibiting thermally activated delayed fluorescence (a thermally activated delayed fluorescent (TADF) material).

Figure 1B:
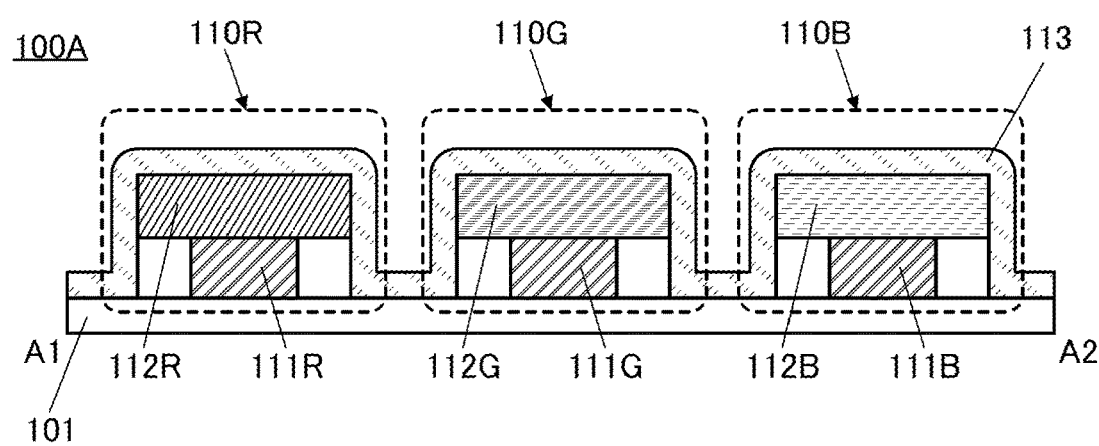
Figure 2:
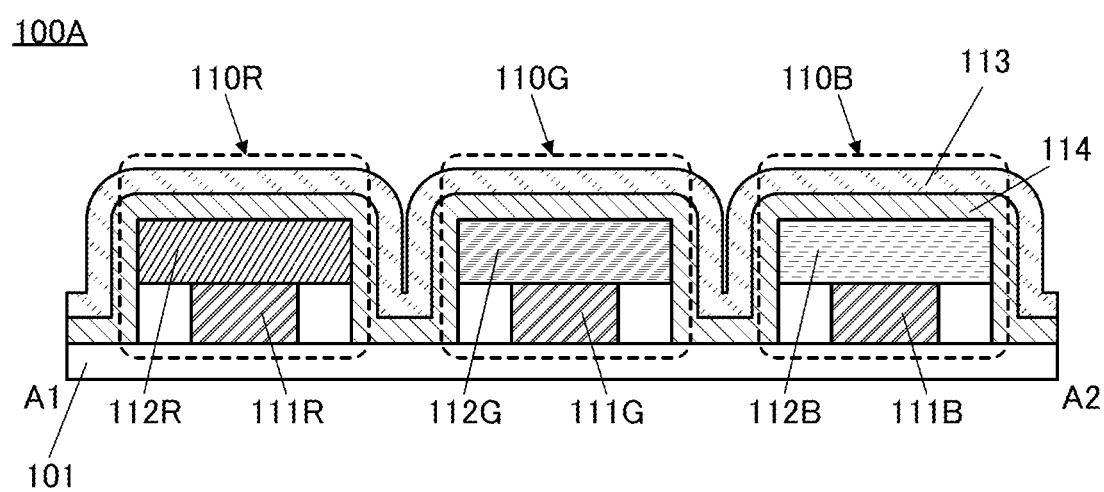
FIG. 2 illustrates a structure example of a display device.

FIG. 1B and FIG. 2 are each an example of a schematic cross-sectional view taken along dashed-dotted line A1-A2 in FIG. 1A, and show a structure in which light-emitting elements of different colors are adjacent to each other. FIG.

1C is an example of a schematic cross-sectional view taken along dashed-dotted line B1-B2 and shows a structure in which light-emitting elements of the same color are adjacent to each other.

The light-emitting element 110R includes a pixel electrode 111R, an EL layer 112R, and a common electrode 113. The light-emitting element 110G includes a pixel electrode 111G, an EL layer 112G, and the common electrode 113. The light-emitting elements 110B includes a pixel electrode 111B, an EL layer 112B, and the common electrode 113. A light-emitting element 150G includes a pixel electrode 151G, an EL layer 152G, and the common electrode 113.

In the light-emitting element 110R, the EL layer 112R in included between the pixel electrode 111R and the common electrode 113. The EL layer 112R contains a light-emitting organic compound that emits light with intensity at least in a red wavelength range. In the light-emitting elements 110G, the EL layer 112G is included between the pixel electrode 111G and the common electrode 113. The EL layer 112G contains a light-emitting organic compound that emits light with intensity at least in a green wavelength range. In the light-emitting elements 110B, the EL layer 112B is included between the pixel electrode 111B and the common electrode 113. The EL layer 112B contains a light-emitting organic compound that emits light with intensity at least in a blue wavelength range. Note that the light-emitting element 150G is similar to the light-emitting elements 110G.

The EL layer 112R, the EL layer 112G, and the EL layer 112B each include a layer containing a light-emitting organic compound (light-emitting layer). The light-emitting layer may contain one or more kinds of compounds (a host material and an assist material) in addition to a light-emitting substance (guest material). As the host material and the assist material, one or more kinds of substances having a larger energy gap than the light-emitting substance (the guest material) can be used. As the host material and the assist material, compounds which form an exciplex are preferably used in combination. To form an exciplex efficiently, it is particularly preferable to combine a compound that easily accepts holes (hole-transport material) and a compound that easily accepts electrons (electron-transport material).

For the light-emitting element, either a low-molecular compound or a high-molecular compound can be used, and an inorganic compound (e.g., a quantum dot material) may also be used.

The EL layer 112R, the EL layer 112G, and the EL layer 112B may each include one or more of an electron-injection layer, an electron-transport layer, a hole-injection layer, and a hole-transport layer in addition to the light-emitting layer.

The pixel electrode 111R, the pixel electrode 111G, and the pixel electrode 111B are provided for respective light-emitting elements. The common electrode 113 is provided as a layer common to the light-emitting elements. A conductive film that transmits visible light is used for either the respective pixel electrodes or the common electrode 113, and a reflective conductive film is used for the other. When the respective pixel electrodes are light-transmitting electrodes and the common electrode 113 is a reflective electrode, a bottom-emission display device is obtained. When the respective pixel electrodes are reflective electrodes and the common electrode 113 is a light-transmitting electrode, a top-emission display device is obtained. Note that when both the respective pixel electrodes and the common electrode 113 transmit light, a dual-emission display device can be obtained.

In addition, in the display device of one embodiment of the present invention, as illustrated in FIG. 1B, the light-emitting element 110R over a substrate 101 includes a region where the pixel electrode 111R is not provided below the EL layer 112R (as specific examples, see FIGS. 3A to 3F, and the like). In the region, the common electrode 113 is preferably positioned not to be in contact with the pixel electrode 111R. In other words, in the region, the common electrode 113 is preferably positioned to be apart from the pixel electrode 111R. Furthermore, the common electrode 113 in the region preferably includes a region overlapping with the EL layer 112R. With such a structure, a short circuit between the common electrode 113 and the pixel electrode 111R can be prevented.

In FIG. 1B, at least part of the end portion of the EL layer 112R may protrude (also referred to stretch) toward the edge direction (also referred to as side-surface direction) more than the end portion of the pixel electrode 111R. Furthermore, at least part of the end portion of the EL layer 112R may be positioned outward from the end portion of the pixel electrode 111R. Furthermore, the end portion of the pixel electrode 111R may positioned inward from the end portion of the EL layer 112R.

In addition, in FIG. 1B, a top surface of the end portion of the pixel electrode 111R is preferably in contact with the EL layer 112R.

In the cross section, the end portion of the pixel electrode 111R is preferably positioned on an inner side than the end portion of the EL layer 112R. In the top view, the pixel electrode 111R is preferably smaller than the EL layer 112R. Furthermore, in the top view, the pixel electrode 111R preferably includes a region positioned on an inner side than the EL layer 112R.

A layer including a circuit and the like (described later) may be provided over the substrate 101. In that case, the substrate 101 may be regarded as including the layer. The substrate 101 or the layer preferably has an insulating surface. The common electrode 113 preferably includes a region in contact with the substrate 101 (e.g., an insulating surface).

Although the above description is for one of end portions of the light-emitting element 110R, the same structure can be applied to the other end portion of the light-emitting element 110R, end portions of the light-emitting element 110G, end portions of the light-emitting element 110B, or end portions of the light-emitting element 150G.

Figure 1C:
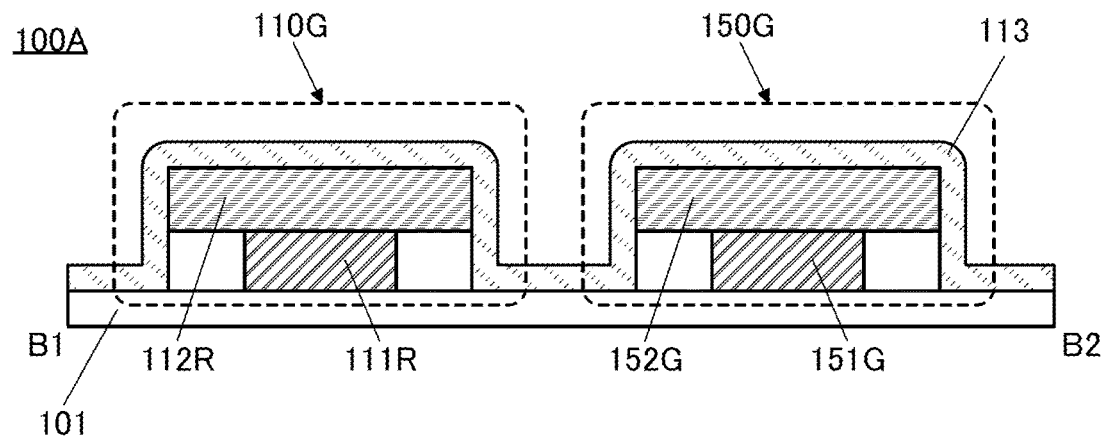

FIG. 2 illustrates a structure in which a common layer 114 is provided between the EL layer 112R and the common electrode 113. The common layer 114 corresponds to, for example, an electron-transport layer or an electron-injection layer, but is not limited thereto. Hereinafter, the structures illustrated in FIGS. 1B and 1C and FIG. 2 are described in detail.

Enlarged views of the vicinity of one end portion of the light-emitting elements 110R are exemplified in FIG. 3A to FIG. 7E. Note that the description here uses only the vicinity of one end portion of the light-emitting element 110R for simplicity; however, the same structure can be applied to the other end portion of the light-emitting element 110R, end portions of the light-emitting element 110G, end portions of the light-emitting element 110B, or end portions of the light-emitting element 150G.

Figure 3A:
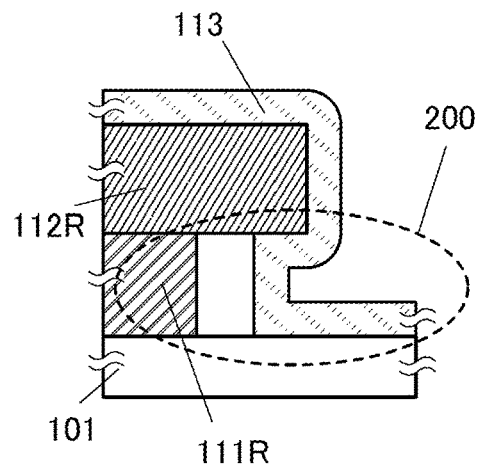
FIGS. 3A to 3F each illustrate a structure example of a display device.

FIG. 3A illustrates an example of a structure including a region 200 where the pixel electrode 111R is not provided below the end portion of the EL layer 112R. In this structure, the common electrode 113 can be positioned to be led inwardly to a place under the EL layer 112R. In other words, the region 200 includes a region where the EL layer 112R overlaps with the common electrode 113. In addition, in the region 200, a gap (also referred to as a distance or a space) is preferably provided between the pixel electrode 111R and the common electrode 113. Note that the region 200 includes not only a region vertically under the EL layer 112R but also a region positioned in the diagonally downward direction of the EL layer 112R.

Figure 3B:
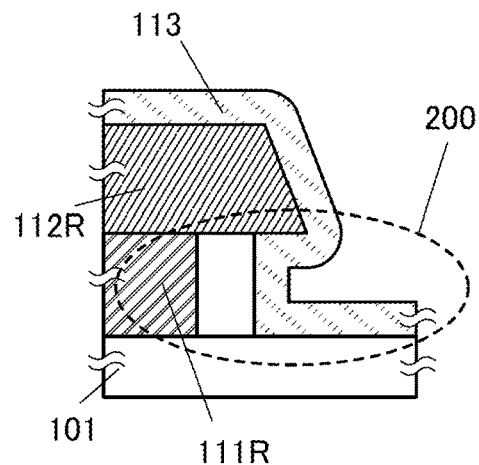

FIG. 3B illustrates an example of a structure where the end portion of the EL layer 112R has a tapered shape and the common electrode 113 is positioned to be aligned with the tapered shape. The end portion of the EL layer 112R preferably has such a shape that a lower end portion protrudes more than an upper end portion. The region 200 includes a region where the EL layer 112R does not overlap with the common electrode 113, whereby the distance between the pixel electrode 111R and the common electrode 113 can be increased. With this structure, the possibility of short circuit between the pixel electrode 111R and the common electrode 113 can be reduced. Note that the end portion of the EL layer 112R may have a structure in which the upper end portion protrudes more than the lower end portion.

Figure 3C:
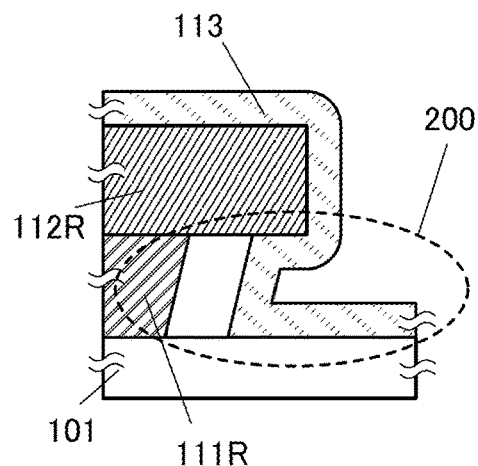

FIG. 3C illustrates a structure where the end portion of the pixel electrode 111R has a tapered shape. The end portion of the pixel electrode 111R preferably has such a shape that the upper end portion protrudes more than the lower end portion. For example, as illustrated in FIG. 3C, in the case where a lower portion of the region 200 has a larger area where the common electrode 113 and the EL layer 112R overlap with each other than an upper portion of the region 200, the common electrode 113 can be favorably embedded in the region 200. When the end portion of the pixel electrode 111R has such a shape that the upper end portion protrudes more than the lower end portion, the possibility of short circuit between the pixel electrode 111R and the common electrode 113 can be reduced even in the case where the common electrode 113 is favorably embedded in the region 200. Note that the end portion of the pixel electrode 111R may have such a structure that the lower end portion protrudes more than the upper end portion.

Figure 3D:
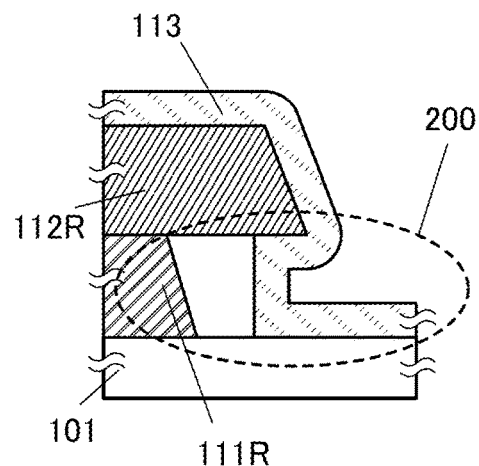
Figure 3E:
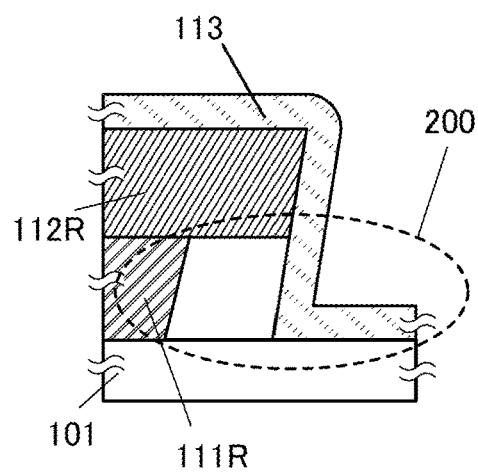

FIGS. 3D and 3E each illustrate a structure in which both the end portion of the EL layer 112R and the end portion of the pixel electrode 111R have a tapered shape. In FIG. 3D, both of the end portions have such a structure that the lower end portion protrudes more than the upper end portion. In FIG. 3E, both of the end portions have such a structure that the upper end portion protrudes more than the lower end portion.

Figure 3F:
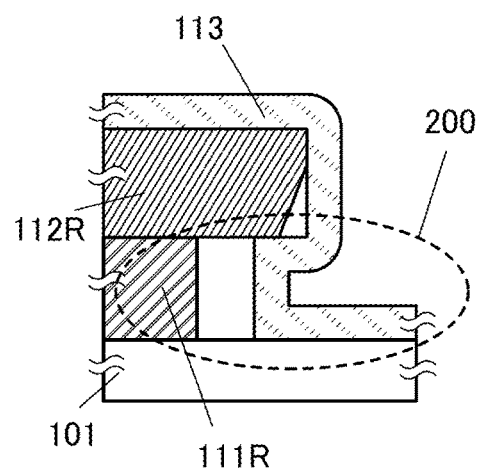

FIG. 3F illustrates a structure in which a side surface of the EL layer 112R has a region is not in contact with the common electrode 113. In this case, a space (also referred to as a distance or a gap) between the EL layer 112R and the common electrode 113 is preferably provided on the side surface of the EL layer 112R.

Figure 4A:
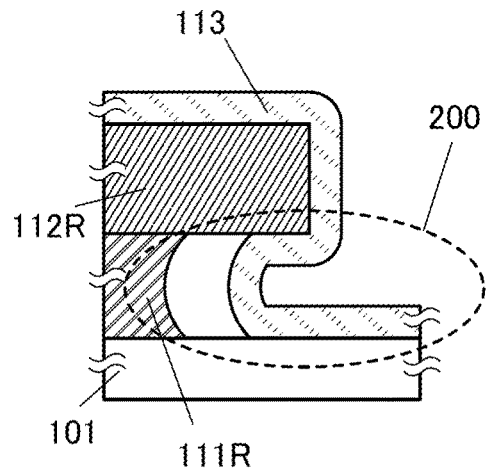
FIGS. 4A to 4C each illustrate a structure example of a display device.

FIG. 4A illustrates a structure of the pixel electrode 111R where the upper end portion and the lower end portion protrude more than a middle portion of a side surface. For example, as illustrated in FIG. 4A, when the common electrode 113 in the middle portion of the region 200 is led more inwardly to a place under the EL layer 112R than that in the upper and lower portions of the region 200, such a structure enables the possibility of short circuit between the pixel electrode 111R and the common electrode 113 to be reduced. The same effect can also be obtained when the middle portion of the region 200 has a larger area where the common electrode 113 and the EL layer 112R overlap with each other than the upper and lower portions of the region 200.

Figure 4B:
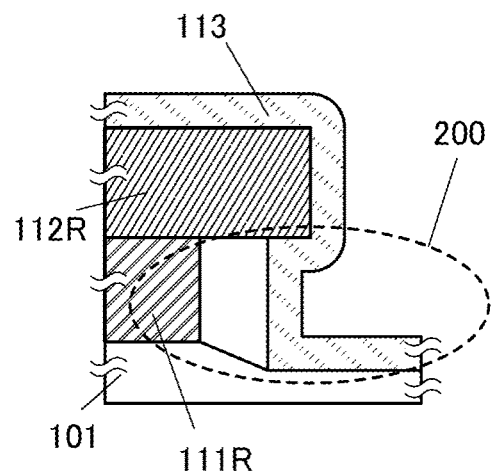

FIG. 4B illustrates a structure of the region 200 where a recess portion is formed on a surface (e.g., insulating surface) of the substrate 101, and the common electrode 113 is positioned in the recess portion. The recess portion can be provided in such a manner that part of the surface of the substrate 101 is etched to be thin. For example, when the substrate 101 in the region 200 has a partly tapered surface as illustrated in FIG. 4B, a region where the EL layer 112R overlaps with the common electrode 113 is from the end portion of the EL layer 112R to the lower end portion of the tapered shape. With such a structure, the possibility of short circuit between the pixel electrode 111R and the common electrode 113 can be reduced. In the region 200, the distance between the EL layer 112R and the substrate 101 may be larger than the thickness of the pixel electrode 111R.

Figure 4C:
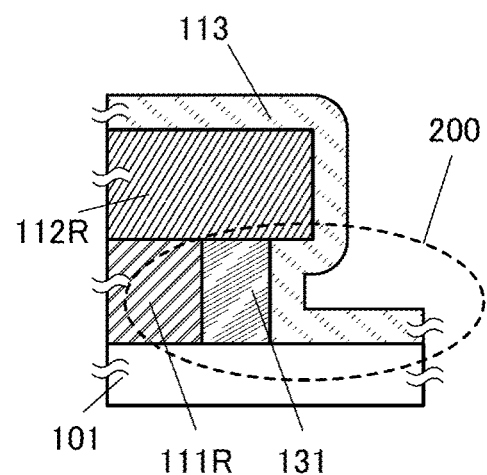

FIG. 4C illustrates a structure where an insulating region 131 is provided between the pixel electrode 111R and the common electrode 113 in the region 200. The insulating region 131 may be formed by making the end portion of the pixel electrode 111R have an insulating property or by providing an insulator additionally on the end portion of the pixel electrode 111R. Furthermore, a structure in which the end portion of the pixel electrode 111R is covered with an insulator may be employed. With such a structure, the possibility of short circuit between the pixel electrode 111R and the common electrode 113 can be reduced. Note that a gap (also referred to as a distance or a space) may be provided between the insulating region 131 and the common electrode 113. Moreover, a gap (also referred to as a distance or a space) may be provided between the insulating region 131 and the pixel electrode 111R.

Figure 5A:
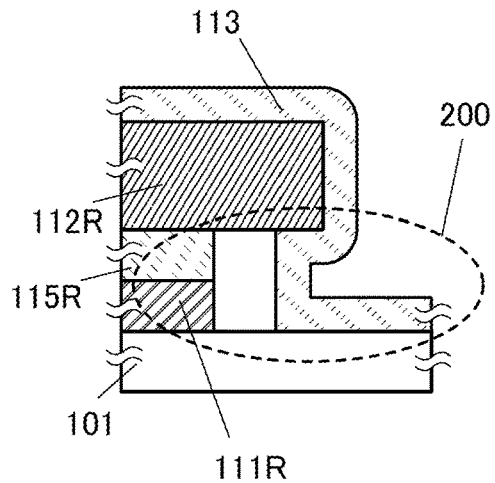
FIGS. 5A to 5C each illustrate a structure example of a display device.

FIG. 5A illustrates a structure including an optical adjustment layer 115R between the pixel electrode 111R and the EL layer 112R. At least part of an end portion of the EL layer 112R preferably protrudes in the edge direction more than end portions of the pixel electrode 111R and the optical adjustment layer 115R. Alternatively, not an optical adjustment layer but a layer having a different function can be arranged in a region between the pixel electrode 111R and the EL layer 112R. Note that a stacked body including the pixel electrode and the optical adjustment layer is referred to as a pixel electrode in some cases.

Figure 5B:
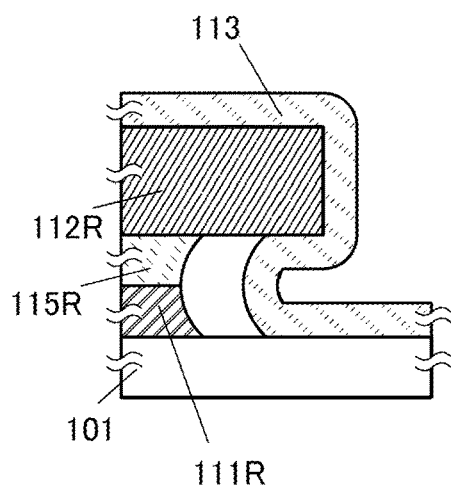

FIG. 5B illustrates a structure where the optical adjustment layer 115R has an upper end portion protruding more than a lower end portion, and the pixel electrode 111R has a lower end portion protruding more than an upper end portion. The structure described with FIG. 4A can be applied to the structure in FIG. 5B, and the same effect as that in FIG. 4A can be obtained. Note that the region 200 is not illustrated in some cases in FIG. 5B and the following drawings, considering the visibility of the drawings; the region is positioned below the EL layer 112R.

Figure 5C:
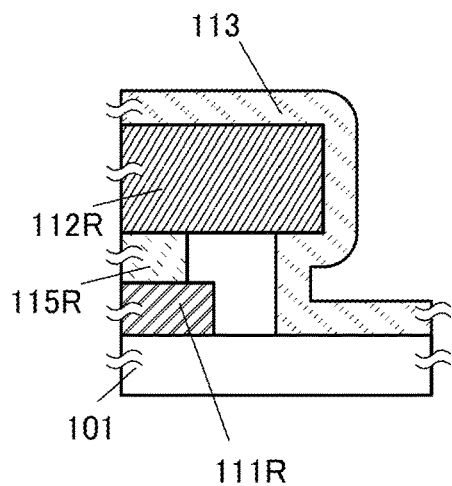

FIG. 5C illustrates a structure different from that in FIG. 5A, in that the end portions of the EL layer 112R and the pixel electrode 111R protrude more than the end portion of the optical adjustment layer 115R.

Figure 6A:
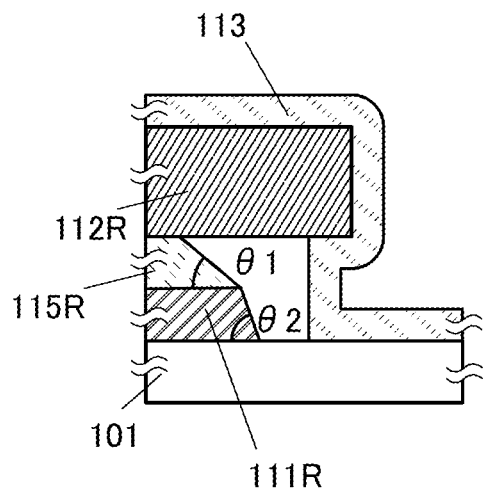
FIGS. 6A to 6D each illustrate a structure example of a display device.
Figure 6B:
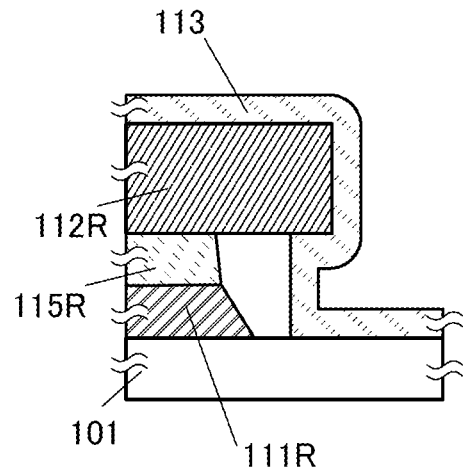

FIGS. 6A and 6B each illustrate a structure where the end portions of the optical adjustment layer 115R and the pixel electrode 111R illustrated in FIG. 5A have tapered shapes. The taper angles of the optical adjustment layer 115R and the pixel electrode 111R may be the same or different from each other. When being formed using different materials, the optical adjustment layer 115R and the pixel electrode 111R preferably have different taper angles in terms of formation easiness. FIG. 6A shows a case where a taper angle θ1 of the optical adjustment layer 115R is smaller than a taper angle θ2 of the pixel electrode 111R. FIG. 6B shows a case where the taper angle of the optical adjustment layer 115R is larger than the taper angle of the pixel electrode 111R. Note that the taper angle indicates an angle formed by a lower side and an oblique side of a layer in a cross-sectional view.

Figure 6C:
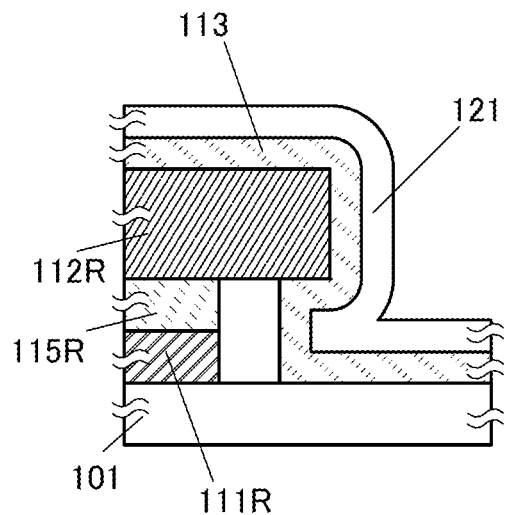

FIG. 6C illustrates a structure where a protective layer 121 is provided over the common electrode 113. The protective layer 121 has a function of preventing diffusion of impurities such as water into each light-emitting element from above.

Figure 6D:
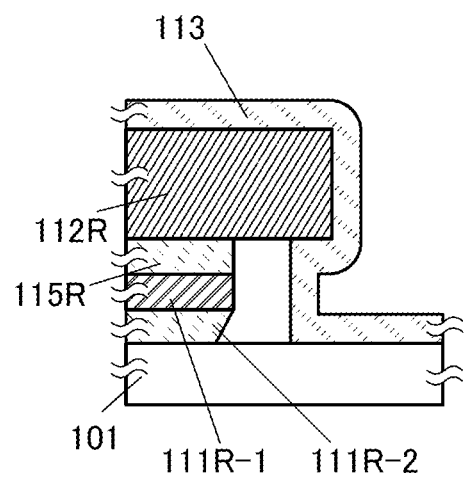

FIG. 6D illustrates a structure in which the pixel electrode 111R has a stacked structure. For example, a light-transmitting pixel electrode 111R-1 and a reflective pixel electrode 111R-2 can be stacked. In addition, the pixel electrode 111R-1 or the pixel electrode 111R-2 may have a tapered shape.

FIGS. 7A to 7E illustrate specific examples of the structure including the common layer 114 illustrated in FIG. 2. The common layer 114 corresponds to, for example, an electron-transport layer or an electron-injection layer.

Figure 7A:
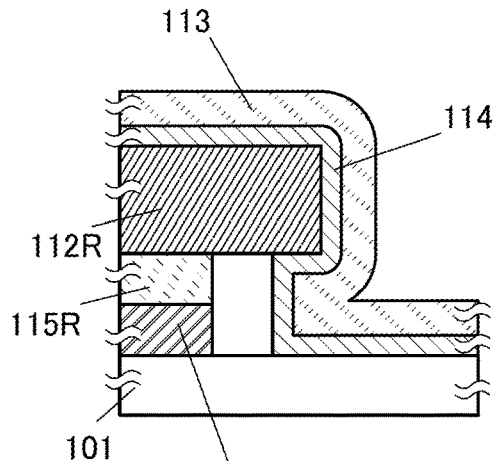
FIGS. 7A to 7E each illustrate a structure example of a display device.

FIG. 7A illustrates a structure where the common layer 114 is positioned between the EL layer 112R and the common electrode 113. The common layer 114 is also positioned to overlap with a surface (also referred to as a top surface) and a side surface of the EL layer 112R. In other words, the common layer 114 on the tope surface and the side surface of the EL layer 112R is positioned between the EL layer 112R and the common electrode 113. The common layer 114 in the region 200 is positioned between the common electrode 113 and the pixel electrode 111R and the like. Furthermore, the common layer 114 may be positioned in contact with the substrate 101.

Figure 7B:
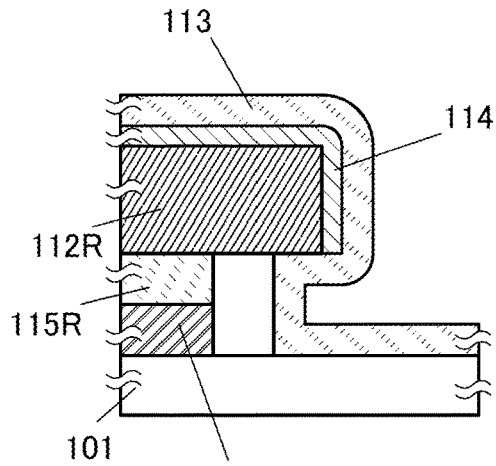
Figure 7C:
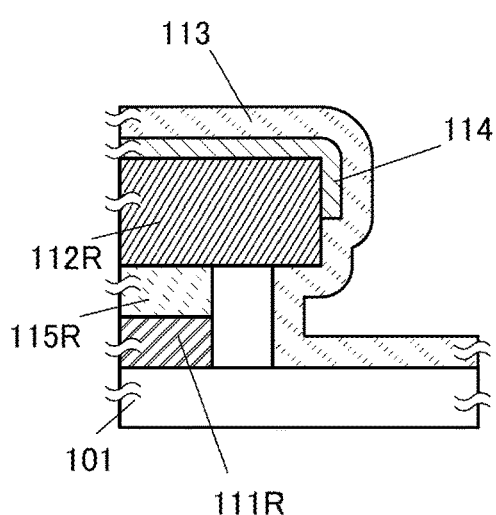

FIG. 7B illustrates a structure where the region 200 is not provided with the common layer 114 between the common electrode 113 and the pixel electrode 111R and the like. FIG. 7C illustrates a structure where the common layer 114 is positioned to overlap with part of the side surface of the EL layer 112R.

Figure 7D:
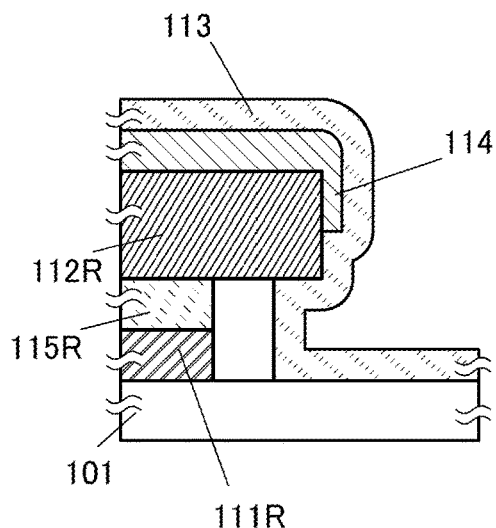
Figure 7E:
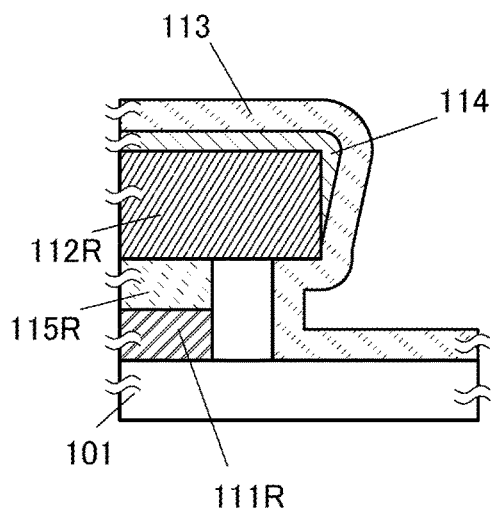

FIG. 7D illustrates a structure where the thickness of the common layer 114 differs depending on portions, i.e., a portion overlapping with the top surface of the EL layer 112R and a portion overlapping with the side surface of the EL layer 112R. It is preferable that the thickness of the common layer 114 overlapping with the top surface be larger than that of the common layer 114 overlapping with the side surface because processing is facilitated in some cases. As illustrated in FIG. 7E, the common layer 114 overlapping with the side surface of the EL layer 112R may have such a structure that the thickness of the lower portion (close to the substrate 101) is smaller than that of the upper portion (far from the substrate 101).

The structures illustrated in FIG. 5A to FIG. 7E can be described with expression used for the description with FIG. 1A to FIG. 3F as appropriate. Similarly, in this specification, expression used for describing FIG. 1A to FIG. 7E can be used for description of the other drawings as appropriate.

As described above, the end portions of the light-emitting elements can have a variety of structures. The structures illustrated in the above drawings can be combined with each other as appropriate. For example, the structure in which the surface of the substrate 101 has a recess portion as illustrated in FIG. 4B may be combined with any of the structures in FIG. 5A to FIG. 7E. Alternatively, the end portion of the optical adjustment layer 115R as illustrated in FIGS. 7A to 7E may have a tapered shape as illustrated in FIG. 6A or FIG. 6B. As described, a variety of structures in this specification is combined as appropriate, whereby the display device 100A of one embodiment of the present invention can have a synergistic effect.

[Example of Manufacturing Method of Display Device]

An example of a method for manufacturing the display device of one embodiment of the present invention is described below with reference to the drawings. Here, description is made with use of the display device 100A shown in the above structure example. FIGS. 8A to 8F are cross-sectional schematic views of steps in a manufacturing method of a display device described below.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. Examples of the CVD method include a plasma-enhanced CVD (PECVD) method and a thermal CVD method. An example of a thermal CVD method includes a metal organic CVD (MOCVD) method.

Alternatively, thin films included in the display device (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

When thin films included in the display device are processed, a photolithography method or the like can be used for the processing. Besides, a nanoimprinting method, a sandblasting method, a lift-off method, or the like may be used to process thin films. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV, X-rays, or an electron beam because extremely fine processing can be performed. Note that a photomask is not needed when exposure is performed by scanning with a beam such as an electron beam.

For etching of thin films, a dry etching method, a wet etching method, a sandblast method, or the like can be used.

[Preparation for Substrate 101]

The substrate 101 preferably has heat resistance high enough to withstand at least heat treatment performed later. As the substrate 101 having an insulating property, a glass substrate, a quartz substrate, a sapphire substrate, a ceramic substrate, an organic resin substrate, or the like can be used. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed. The substrate 101 over which various circuits are formed preferably has an insulating surface.

[Formation of Conductive Film 111*f*]

Next, a conductive film 111*f* to be a pixel electrode 111 (the pixel electrode 111R, the pixel electrode 111G, and the pixel electrode 111B) is formed over the substrate 101.

In the case where a conductive film reflecting visible light is used as the pixel electrode, it is preferable to use a material (e.g., silver or aluminum) having reflectance as high as possible in the whole wavelength range of visible light. With such a material, both higher outcoupling efficiency of the light emitting element and higher color reproducibility can be obtained. Furthermore, a plurality of conductive films may be provided. For example, a reflective conductive film may be stacked over a light-transmitting conductive film.

[Formation of EL Film 112Rf]

Next, an EL film 112Rf that is to be the EL layer 112R later is formed over the conductive film 111*f*.

The EL film 112Rf includes at least a film containing a light-emitting compound. A structure may be employed in which at least one of films functioning as an electron-injection layer, an electron-transport layer, a charge-generation layer, a hole-transport layer, and a hole-injection layer is stacked in addition to the above. The EL film 112Rf can be formed by, for example, an evaporation method, a sputtering method, an inkjet method, or the like. Without limitation to this, the above-described film-formation method can be used as appropriate.

[Formation of Sacrificial Film 144*a*]

Next, a sacrificial film 144*a* is formed to cover the EL film 112Rf.

As the sacrificial film 144*a*, it is preferable to use a film highly resistant to etching treatment performed on various EL films such as the EL film 112Rf, i.e., a film having high etching selectivity with respect to the EL film. Furthermore, as the sacrificial film 144*a*, it is preferable to use a film having high etching selectivity with respect to a protective film such as a protective film 146*a* described later. Moreover, as the sacrificial film 144*a*, it is preferable to use a film that can be removed by a wet etching method less likely to cause damage to the EL film.

The sacrificial film 144*a* can be formed using an inorganic film such as a metal film, an alloy film, a metal oxide film, a semiconductor film, or an inorganic insulating film, for example.

Alternatively, the sacrificial film 144*a* can be formed using a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material. It is particularly preferable to use a low-melting-point material such as aluminum or silver.

Alternatively, the sacrificial film 144*a* can be formed using a metal oxide such as an indium-gallium-zinc oxide (In—Ga—Zn oxide, also referred to as IGZO). Furthermore, the following material can be used: indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon, or the like can also be used.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum and yttrium.

Alternatively, the sacrificial film 144*a* can be formed using an inorganic insulating material such as aluminum oxide, hafnium oxide, or silicon oxide. Use of an insulating material containing oxygen is preferable because damage to the EL film 112Rf can be alleviated.

Note that a structure without the sacrificial film 144*a* can also be employed. The process can be simplified when the sacrificial film 144*a* is omitted.

[Formation of Protective Film 146*a*]

Next, the protective film 146*a* is formed over the sacrificial film 144*a*.

The protective film 146*a* is a film used as a hard mask when the sacrificial film 144*a* is etched later. In a later step of processing the protective film 146*a*, the sacrificial film 144*a* is exposed. Thus, the combination of films having high etching selectivity therebetween is selected for the sacrificial film 144*a* and the protective film 146*a*. It is preferable to select a film that can be used for the protective film 146*a* depending on an etching condition of the sacrificial film 144*a* and an etching condition of the protective film 146*a*.

For example, in the case where dry etching using a gas containing fluorine (also referred to as a fluorine-based gas) is performed for the etching of the protective film 146*a*, the protective film 146*a* can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a metal oxide film using IGZO, ITO, or the like is given as a film having high etching selectivity (that is, enabling low etching rate) in dry etching using the fluorine-based gas, and such a film can be used as the sacrificial film 144*a*.

Without being limited to the above, a material of the protective film 146*a* can be selected from a variety of materials depending on etching conditions of the sacrificial film 144*a* and the protective film 146*a*. For example, a material of the protective film 146*a* can be selected from the above-described films that can be used for the sacrificial film 144*a*.

As the protective film 146*a*, a nitride film can be used, for example. Specifically, a nitride such as silicon nitride, aluminum nitride, hafnium nitride, titanium nitride, tantalum nitride, tungsten nitride, gallium nitride, or germanium nitride can be used.

Alternatively, as the protective film 146*a*, an organic film that can be used for the EL film 112Rf or the like can be used. For example, the protective film 146*a* can be formed using the same organic film that are used for the EL film 112Rf, an EL film 112Gf, or an EL film 112Bf. Use of such an organic film for the protective film 146*a* is preferable because the same film-formation apparatus can be used for formation of the EL film 112Rf or the like.

Note that a structure without the protective film 146a can be employed. The process can be simplified when the protective film 146a is omitted.

[Formation of Resist Mask 143a]

Figure 8A:
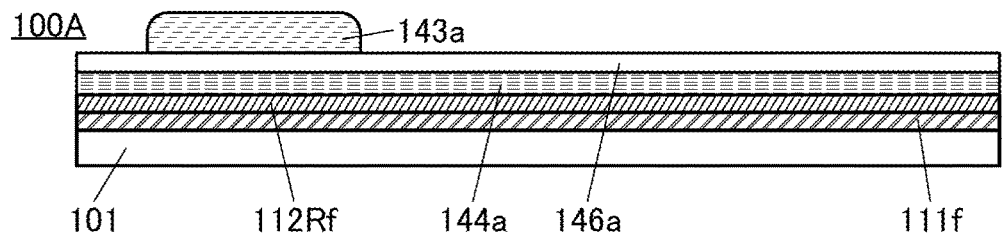
FIGS. 8A to 8F illustrate an example of a method for manufacturing a display device.

Next, a resist mask 143a is formed over the protective film 146a (FIG. 8A).

For the resist mask 143a, a resist material using a photosensitive resin such as a positive type resist material or a negative type resist material can be used.

On the assumption that the resist mask 143a is formed over the sacrificial film 144a without the protective film 146a therebetween, there is a risk of dissolving the EL film 112Rf due to a solvent of the resist material if a defect such as a pinhole exists in the sacrificial film 144a. Also in the case where the resist mask 143a is formed over the EL film 112Rf without the sacrificial film 144a, there is a similar risk of dissolving the EL film 112Rf. Thus, with use of the sacrificial film 144a and the protective film 146a, such a problem can be prevented.

[Etching of Protective Film 146a]

Next, part of the protective film 146a that is not covered with the resist mask 143a is removed by etching, so that an island-shaped or band-shaped protective layer 147a can be formed.

In the etching of the protective film 146a, an etching condition with high selectively is preferably employed so that the sacrificial film 144a is not removed by the etching. Either wet etching or dry etching can be performed for the etching of the protective film 146a. With use of dry etching, a reduction in a processing pattern of the protective film 146a can be inhibited.

[Removal of Resist Mask 143a]

Then, the resist mask 143a is removed.

The removal of the resist mask 143a can be performed by wet etching or dry etching. It is particularly preferable to perform dry etching (also referred to as plasma ashing) using an oxygen gas as an etching gas to remove the resist mask 143a.

At this time, the removal of the resist mask 143a is performed in a state where the EL film 112Rf is covered with the sacrificial film 144a; thus, the EL film 112Rf is less likely to be affected by the removal. In particular, when the EL film 112Rf is exposed to oxygen, the electrical characteristics of the light-emitting element are adversely affected in some cases. Therefore, it is preferable that the EL film 112Rf be covered by the sacrificial film 144a when etching using an oxygen gas, such as plasma ashing, is performed.

[Etching of Sacrificial Film 144a]

Next, part of the protective layer 147a that is not covered with the sacrificial film 144a is removed with use of the protective layer 147a as a mask, so that an islands-shaped or band-shaped sacrificial layer 145a is formed.

Either wet etching or dray etching can be performed for the etching of the sacrificial film 144a. With use of dry etching, a reduction in a processing pattern of the sacrificial film 144a can be inhibited.

[Etching of EL Film 112Rf]

Figure 8B:
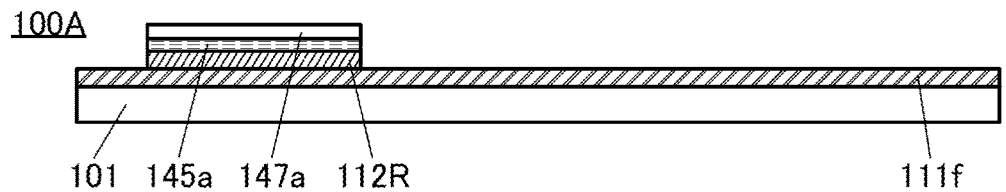

Next, part of the EL film 112Rf that is not covered with the sacrificial layer 145a is removed by etching, so that an island-shaped or band-shaped EL layer 112R is formed (FIG. 8B).

For the etching of the EL film 112Rf, it is preferable to perform dry etching using an etching gas that does not contain oxygen as its main component. This is because the alteration of the EL film 112Rf is inhibited, and a highly reliable display device can be achieved. Examples of the etching gas that does not contain oxygen as its main component include $CF_4$, $C_4F_8$, $SF_6$, $CHF_3$, $Cl_2$, $H_2O$, $BCl_3$, or a rare gas such as He. Alternatively, a mixed gas of the above gas and a dilution gas that does not contain oxygen can be used the etching gas. In the etching of the EL film 112Rf, the protective layer 147a may be removed.

[Formation of EL Layer 112G and EL Layer 112B]

Next, the EL film 112Gf that is to be the EL layer 112G in a later step is formed over the sacrificial layer 145a and the exposed conductive film 111f. For the EL film 112Gf, the description of the EL film 112Rf can be referred to.

Then, a sacrificial layer 144b is formed over the EL film 112Gf, and a protective film 146b is formed over the sacrificial layer 144b. For the sacrificial layer 144b, the description of the sacrificial film 144a can be referred to. For the protective film 146b, the description of the protective film 146a can be referred to.

Figure 8C:
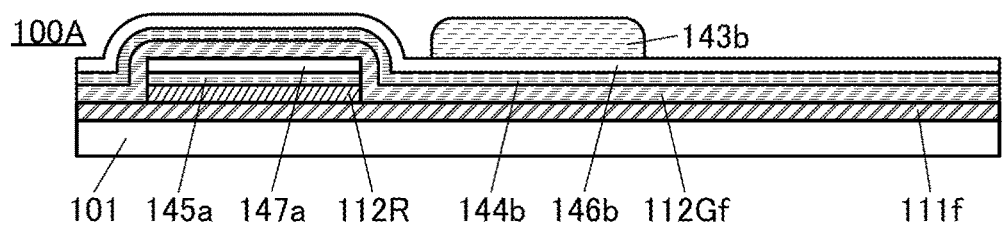

Next, a resist mask 143b is formed over the protective film 146b (FIG. 8C).

Then, the protective film 146b is etched with use of the resist mask 143b, so that a protective layer 147b is formed. After that, the resist mask 143b is removed.

Figure 8D:
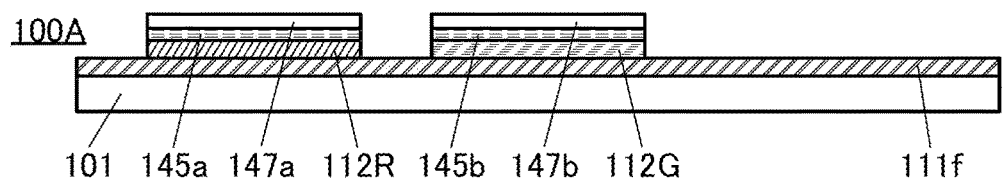

Next, the sacrificial layer 144b and the EL film 112Gf are each etched with use of the protective layer 147b as a mask, so that a sacrificial layer 145b and the EL layer 112G are formed (FIG. 8D).

Next, the EL film 112Bf that is to be the EL layer 112B in a later step is formed over the sacrificial layer 145a, the sacrificial layer 145b, and the exposed conductive film 111f. For the EL film 112Bf, the description of the EL film 112Rf can be referred to.

Next, a sacrificial layer 144c is formed over the EL film 112Bf, and a protective film 146c is formed over the sacrificial layer 144c. For the sacrificial layer 144c, the description of the sacrificial film 144a can be referred to. For the protective film 146c, the description of the protective film 146a can be referred to.

Figure 8E:
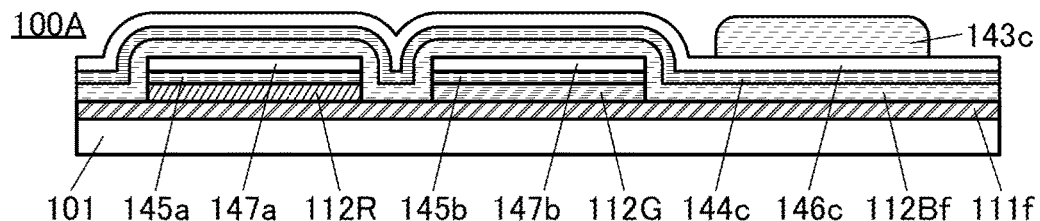

Next, a resist mask 143c is formed over the protective film 146c (FIG. 8E).

Then, the protective film 146c is etched with use of the resist mask 143c, so that a protective layer 147c is formed. After that, the resist mask 143c is removed.

Figure 8F:
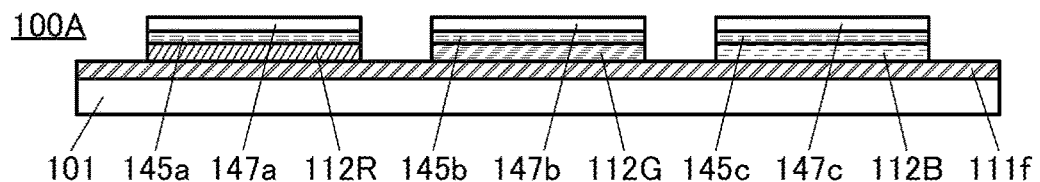

Next, the sacrificial layer 144c and the EL film 112Bf are each etched with use of the protective layer 147c as a mask, so that a sacrificial layer 145c and the EL layer 112B are formed (FIG. 8F).

[Formation of Pixel Electrodes 111R, 111G, and 111B]

Next, part of the conductive film 111f that is not covered with the EL layer 112R, the EL layer 112G, the EL layer 112B, the sacrificial layer 145a, the sacrificial layer 145b, the sacrificial layer 145c, the protective layer 147a, the protective layer 147b, or the protective layer 147c is etched, so that the pixel electrode 111R, the pixel electrode 111G, and the pixel electrode 111B are formed.

Figure 9A:
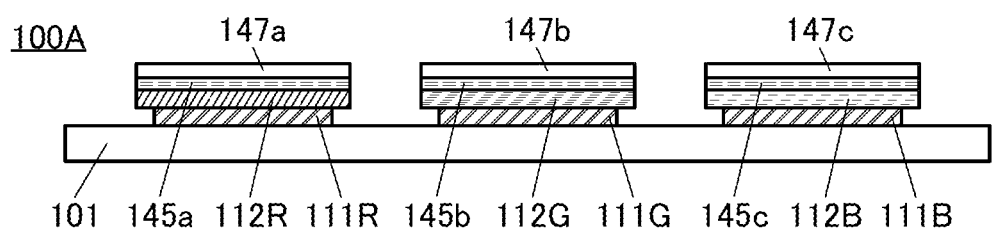
FIGS. 9A to 9C illustrate an example of a method for manufacturing a display device.

Note that at this time, the etching for forming the pixel electrode 111R, the pixel electrode 111G, and the pixel electrode 111B is performed (FIG. 9A) so that each pixel electrode is not provided in a region below the end portion of the EL layer (the region 200 in FIGS. 3A to 3F and the like) as illustrated in FIG. 1B.

Either wet etching or dry etching can be performed for the etching of the conductive film 111f, and the etching condition is changed as appropriate, whereby processing into the shape illustrated in FIG. 1B is possible. Specifically, wet etching enables formation of a pixel electrode whose end portions are overetched (also referred to as side etched). Alternatively, when dry etching is performed, an etching gas that does not contain oxygen as its main component is used, whereby damage to an EL layer 112 (the EL layer 112R, the EL layer 112G, and the EL layer 112B) can be alleviated. With the combination of these methods as appropriate, the conductive film 111*f* can be processed into a desired shape.

Note that the etching of the conductive film 111*f* may be performed before the formation of the EL film 112Rf and after the formation of the conductive film 111*f* illustrated in FIG. 8A. In that case, when the side etching of the conductive film 111*f* is performed as described, damage to the EL layer 112 may be alleviated.

Furthermore, after the pixel electrode 111R, the pixel electrode 111G, and the pixel electrode 111B are formed as described, the side surfaces of the pixel electrodes are altered, whereby an insulator may be formed on the side surfaces. For example, each of the side surfaces is oxidized to have a region containing oxygen. In this manner, an insulating region can be formed in the region 200 as illustrated in FIG. 4C, and each of the pixel electrodes can be prevented from being in contact with the common electrode 113. Note that an insulating layer may be formed on each side surface by a method other than the alteration of the side surface of the pixel electrode.

[Removal of Protective Layers 147*a* to 147*c* and Sacrificial Layers 145*a* to 145*c*]

Figure 9B:
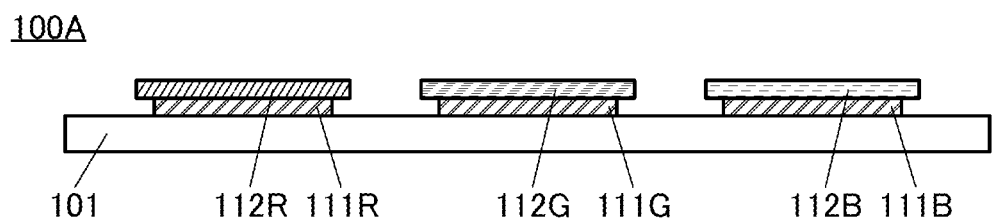

Next, the protective layer 147*a*, the protective layer 147*b*, the protective layer 147*c*, the sacrificial layer 145*a*, the sacrificial layer 145*b*, and the sacrificial layer 145*c* are removed, whereby top surfaces of the EL layer 112R, the EL layer 112G, and the EL layer 112B are exposed (FIG. 9B).

The protective layer 147*a*, the protective layer 147*b*, and the protective layer 147*c* can be removed by wet etching or dry etching.

The sacrificial layer 145*a*, the sacrificial layer 145*b*, and the sacrificial layer 145*c* can be removed by wet etching or dry etching. At this time, a method that causes damage to the EL layer 112R, the EL layer 112G, and the EL layer 112B as little as possible is preferably employed. In particular, a wet etching method is preferably used. For example, wet etching using a tetramethyl ammonium hydroxide (TMAH) solution, diluted hydrofluoric acid, oxalic acid, phosphoric acid, acetic acid, nitric acid, or a mixed solution thereof is preferably performed. With use of the conditions of wet etching, for example, damage to the insulating layer can be alleviated.

In this manner, the EL layer 112R, the EL layer 112G, and the EL layer 112B can be formed separately.

[Formation of Common Electrode 113]

Figure 9C:
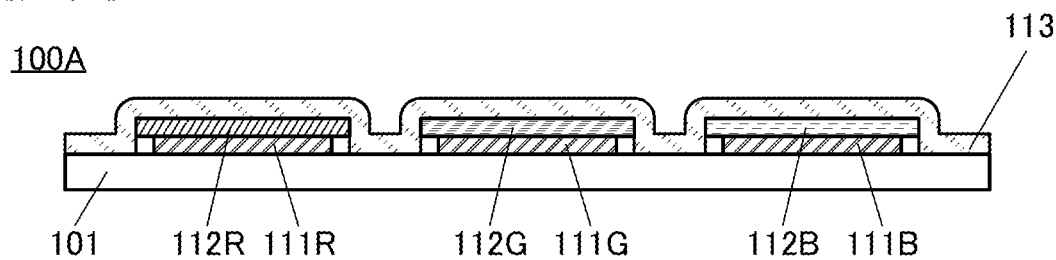

Next, the common electrode 113 is formed to cover the EL layer 112R, the EL layer 112G, and the EL layer 112B (FIG. 9C). The common electrode 113 can be formed by a sputtering method or an evaporation method, for example. The deposition condition of the common electrode 113, the shape or thickness of the EL layer, or the shape or thickness of the pixel electrode is changed as appropriate, whereby the common electrode 113 can be formed into the shape as illustrated in FIG. 1B.

Through the above steps, the display device 100A including the light-emitting element 110R, the light-emitting element 110G, and the light-emitting element 110B as illustrated in FIGS. 1B and 1C can be manufactured.

[Modification Example of Manufacturing Method]

A modification example of the above-described manufacturing method example is described below.

[Formation of Protective Layer 121]

The protective layer 121 may be formed over the common electrode 113 in FIG. 9C. FIG. 6C illustrates a detailed structure where the protective layer 121 is formed. The protective layer 121 has a function of preventing diffusion of impurities such as water into each light-emitting element from the above.

The protective layer 121 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, the top surface of the organic insulating film can be flat, and accordingly, coverage with the inorganic insulating film over the organic insulating film is improved, leading to an improvement in barrier properties. Moreover, since the top surface of the protective layer 121 is flat, a preferable effect can be obtained; when a component (e.g., a color filter, an electrode of a touch sensor, a lens array, or the like) is provided above the protective layer 121, the component is less affected by an uneven shape caused by the lower structure.

The protective layer 121 is preferably formed by a sputtering method, a PECVD method, or an ALD method. In particular, an ALD method is preferable because a film deposited by ALD has good step coverage and is less likely to cause a defect such as pinhole. The organic insulating film is preferably formed by an inkjet method because a uniform film can be formed in a desired area.

A layer (also referred to as a cap layer or as a protective layer) may be provided between the common electrode 113 and the protective layer 121. The cap layer has a function of preventing light emitted from the light-emitting elements from being totally reflected by light. The cap layer is preferably formed using a material having a higher refractive index than the common electrode 113. The cap layer can be formed using an organic substance or inorganic organic substance. The thickness of the cap layer is preferably larger than that of the common electrode 113. The cap layer may have a function of preventing diffusion of impurities such as water from the above into each of the light-emitting elements.

[Formation of Common Layer 114]

The common layer 114 may be formed over the EL layer 112R, the EL layer 112G, and the EL layer 112B illustrated in FIG. 9B. FIGS. 7A to 7E each illustrate a detailed structure where the common layer 114 is formed.

Like the common electrode 113, the common layer 114 is provided across a plurality of light-emitting elements. The common layer 114 is provided to cover the EL layer 112R, the EL layer 112G, and the EL layer 112B. When the common layer 114 is included, the manufacturing process can be simplified, so that the manufacturing cost can be reduced. The common layer 114 and the common electrode 113 can be formed successively without a step such as etching performed between the formations of the common layers 114 and 113. Thus, the interface between the common layer 114 and the common electrode 113 can be clean, and the light-emitting element can have favorable characteristics.

The common layer 114 is preferably in contact with one or more of the top surfaces of the EL layer 112R, the EL layer 112G, and the EL layer 112B.

Each of the EL layer 112R, the EL layer 112G, and the EL layer 112B preferably includes at least a light-emitting layer containing a light-emitting material emitting one color. The common layer 114 preferably includes one or more of an electron-injection layer, an electron-transport layer, a hole-injection layer, and a hole-transport layer, for example. In the light-emitting element in which the pixel electrode serves as an anode and the common electrode serves as a cathode, a structure including the electron-injection layer or a structure including the electron-injection layer and the electron-transport layer can be used as the common layer 114.

The common layer 114 can be formed by, for example, an evaporation method, a sputtering method, or an inkjet method. Without limitation to this, the above-described film-formation method can be used as appropriate. With control of the film-formation condition, the structure illustrated in any of FIGS. 7A to 7E can be formed.

[Formation of Optical Adjustment Layer 115R]

A film that is to be the optical adjustment layer 115R may be formed over the conductive film 111$f$ in FIG. 8A. In that case, in the step in FIG. 9A, the conductive film 111$f$ and the film to be the optical adjustment layer 115R are etched to form a stack of the pixel electrode 111R and the optical adjustment layer 115R. FIG. 5A to FIG. 7E each illustrate a detailed structure where the optical adjustment layer 115R is formed.

In the case where the thickness of the optical adjustment layer differs between the light-emitting elements, in each of the steps of FIGS. 8A, 8C, and 8E, the film to be the optical adjustment layer is formed to have a desired thickness before the EL layer (e.g., the EL layer 112R) is formed. Then, the film to be the optical adjustment layer may be etched together with the EL layer (e.g., the EL layer 112R). After that, in the step of FIG. 9A, the conductive film 111$f$ and the optical adjustment layers can be subjected to side etching together.

An optical adjustment layer 115 (including the optical adjustment layer 115R, an optical adjustment layer 115G not illustrated, and an optical adjustment layer 115B not illustrated) can make the optical path length in a microcavity structure different between the light-emitting elements, thereby increasing the intensity of light with a specific wavelength. Thus, a display device with high color purity can be achieved.

For example, with a layer transmitting visible light as the optical adjustment layer, the optical path lengths can vary between the light-emitting elements. For example, an optical adjustment layer 115 may be provided between the pixel electrode 111 and the EL layer 112. As the optical adjustment layer 115, a conductive material that transmits visible light can be used, for example. For example, a conductive oxide such as indium oxide, indium tin oxide, indium zinc oxide, zinc oxide, zinc oxide containing gallium, indium-tin oxide containing silicon, or an indium-zinc oxide containing silicon can be used.

The optical adjustment layer can be formed before the EL film 112Rf is formed and after the conductive film to be the pixel electrodes (111R, 111G, or 111B) is formed. The optical adjustment layers are formed to have different thicknesses, whereby the optical path length can differ between the light-emitting elements. The optical adjustment layers may be formed using conductive films with different thicknesses from each other or may have a single-layer structure, a two-layer structure, or a three-layer structure, in the order of thin thickness.

In the case where the optical adjustment layer 115 is not provided, the thickness of the EL layer 112 differs between the light-emitting elements, whereby a microcavity structure can be obtained. For example, the EL layer 112R of the light-emitting element 110R emitting light whose wavelength is longest can be made to have the largest thickness, and the EL layer 112B of the light-emitting element 110B emitting light whose wavelength is shortest can be made to have the smallest thickness. Without limitation to this, the thickness of the EL layer can be adjusted in consideration of the wavelength of light emitted by the light-emitting element, optical characteristics of the layer included in the light-emitting element, electrical characteristics of the light-emitting element, and the like.

Alternatively, the optical adjustment layer 115 may be combined with the EL layer 112 formed to have a different thickness depending on emitted colors. In that case, the optical adjustment layer 115 can have the same thickness between the light-emitting elements. An example in which this combination is employed is described below.

[Structure Example 2 of Display Device]

Figure 10:
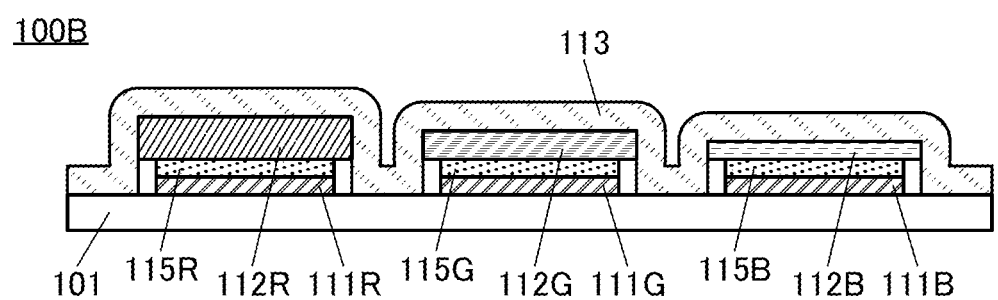
FIG. 10 illustrates a structure example of a display device.

FIG. 10 illustrates a structure example of a display device using optical adjustment layers and EL layers whose thicknesses are different depending on emitted colors.

In a display device 100B illustrated in FIG. 10, the light-emitting element 110R includes the optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B. With the optical adjustment layers, each optical path length can be adjusted.

Furthermore, the thickness of the EL layer 112 is differentiated between the light-emitting elements. In this manner, the optical path length can be optimized for each color, and an optical microcavity structure for each color can be obtained. In the structure illustrated here, the EL layer 112R of the light-emitting element 110R emitting light whose wavelength is longest is formed to have the largest thickness, and the EL layer 112B of the light-emitting element 110B emitting light whose wavelength is shortest is formed to have a smallest thickness. The manufacturing method example of the structure example 2 is as described above.

At least part of any of the structures, the structure examples, the manufacturing method examples, the drawings corresponding thereto, and the like described in this embodiment can be implemented in combination with any of the other structures, the other structure examples, the other manufacturing method examples, the other drawings corresponding thereto, and the like as appropriate.

Embodiment 2

In this embodiment, a structure example of a display device of one embodiment of the present invention will be described.

The display device in this embodiment can be a high-resolution display device or large-sized display device. Accordingly, the display device of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400A]

Figure 11:
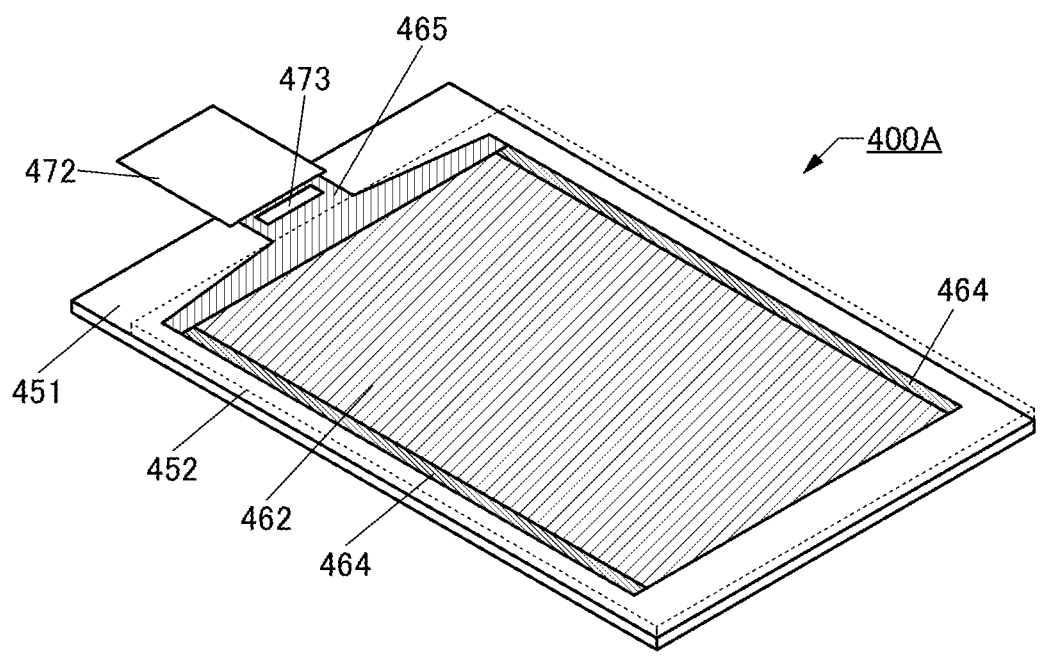
FIG. 11 is a perspective view illustrating an example of a display device.

FIG. 11 is a perspective view of a display device 400A, and FIG. 12A is a cross-sectional view of the display device 400A. Note that as the display device, the display device 100A, the display device 100B, and display devices 400A to 400E, which are disclosed in this specification, can be employed as appropriate.

The display device 400A has a structure where a substrate 452 and a substrate 451 are bonded to each other. In FIG. 11, the substrate 452 is denoted by a dashed line.

The display device 400A includes a display portion 462, a circuit 464 (also referred to as a circuit portion), a wiring 465, and the like. FIG. 11 illustrates an example in which an integrated circuit (IC) 473 and an FPC 472 are implemented on the display device 400A. Thus, the structure illustrated in FIG. 11 can be regarded as a display module including the display device 400A, the IC, and the FPC.

As the circuit 464, a scan line driver circuit can be used, for example.

The wiring 465 has a function of supplying a signal and power to the display portion 462 and the circuit 464. The signal and power are input to the wiring 465 from the outside through the FPC 472 or from the IC 473.

FIG. 11 illustrates an example in which the IC 473 is provided over the substrate 451 by a COG method, a chip on film (COF) method, or the like. An IC including a scan line driver circuit, a signal line driver circuit, or the like can be used as the IC 473, for example. Note that the display devices 400A to 400C and the display module are not necessarily provided with an IC. The IC may be mounted on the FPC by a COF method or the like.

FIG. 12A illustrates an example of cross sections of part of a region including the FPC 472, part of the circuit 464, part of the display portion 462, and part of a region including an end portion of the display device 400A.

The display device 400A illustrated in FIG. 12A includes a transistor 201, a transistor 205, a light-emitting element 430*a* which emits red light, a light-emitting element 430*b* which emits green light, a light-emitting element 430*c* which emits blue light, and the like between the substrate 451 and the substrate 452.

The light-emitting element described in Embodiment 1 or the like can be employed for the light-emitting element 430*a*, the light-emitting element 430*b*, and the light-emitting element 430*c*. Specifically, the common layer 114 and the common electrode 113 can be positioned so as not to be in contact with the pixel electrodes 411*a* to 411*c* in a region below end portions of EL layers 416*a* to 416*c* in the light-emitting elements 430*a* to 430*c*. The protective layer 121 is provided over the common electrode 113.

In the case where a pixel of the display device includes three kinds of subpixels including light-emitting devices emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

The protective layer 121 and the substrate 452 are bonded to each other with the adhesive layer 442. A solid sealing structure, a hollow sealing structure, or the like can be employed to seal the light-emitting elements.

In the case of employing a hollow sealing structure, a region 443 surrounded by the substrate 452, the adhesive layer 442, and the substrate 451 includes a region filled with an inert gas (e.g., nitrogen or argon). The adhesive layer 442 may overlap with the light-emitting element.

In the case of employing a solid sealing structure, an adhesive layer may be provided in the region 443. Alternatively, the adhesive layer 442 is not necessarily provided.

In the display device of one embodiment of the present invention, a gap (also referred to as a distance) is provided between the common electrode 113 and the substrate 452. The gap includes a first gap in a region overlapping with the light-emitting element and a second gap in a region not overlapping with the light-emitting element (the region having the second gap is also referred to as a region between two light-emitting element). The second gap can be larger than the first gap.

Light from the light-emitting element is emitted toward the substrate 452. For the substrate 452, a material having a high visible-light-transmitting property is preferably used.

In addition, a circuit including the transistor is provided below the light-emitting element. The detailed description thereof is given below.

The transistor 201 and the transistor 205 are formed over the substrate 451. These transistors can be fabricated using the same material in the same step.

An insulating layer 211, an insulating layer 213, an insulating layer 215, and an insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display device.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display device 400A. This can inhibit entry of impurities from the end portion of the display device 400A through the organic insulating film. Alternatively, the organic insulating film may be formed so that its end portion is positioned on the inner side compared to the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 12A, an opening is formed in the insulating layer 214, and the protective layer 121 is provided to cover the opening. This can inhibit entry of impurities into the display portion 462 from the outside through the insulating layer 214 even when an organic insulating film is used as the insulating layer 214. Consequently, the reliability of the display device 400A can be increased.

Each of the transistors 201 and 205, includes a conductive layer 221 functioning as a gate, the insulating layer 211 functioning as a gate insulating layer, a conductive layer 222a and a conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case deterioration of the transistor characteristics can be suppressed.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display device of this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, in the case of describing an atomic ratio of In:Ga:Zn=4:2:3 or a composition in the vicinity thereof, the case is included in which with the atomic proportion of In being 4, the atomic proportion of Ga is greater than or equal to 1 and less than or equal to 3 and the atomic proportion of Zn is greater than or equal to 2 and less than or equal to 4. In the case of describing an atomic ratio of In:Ga:Zn=5:1:6 or a composition in the vicinity thereof, the case is included in which with the atomic proportion of In being 5, the atomic proportion of Ga is greater than 0.1 and less than or equal to 2 and the atomic proportion of Zn is greater than or equal to 5 and less than or equal to 7. In the case of describing an atomic ratio of In:Ga:Zn=1:1:1 or a composition in the vicinity thereof, the case is included in which with the atomic proportion of In being 1, the atomic proportion of Ga is greater than 0.1 and less than or equal to 2 and the atomic proportion of Zn is greater than 0.1 and less than or equal to 2.

The transistor included in the circuit 464 and the transistor included in the display portion 462 may have the same structure or different structures. One structure or two or more kinds of structures may be employed for a plurality of transistors included in the circuit 464. Similarly, one structure or two or more kinds of structures may be employed for a plurality of transistors included in the display portion 462.

A connection portion is provided in a region of the substrate 451 where the substrate 452 does not overlap. In the connection portion, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On a top surface of the connection portion, the conductive layer 466 is exposed. Thus, the connection portion and the FPC 472 can be electrically connected to each other through the connection layer 242.

A light-blocking layer 417 is preferably provided on the surface of the substrate 452 on the substrate 451 side. A variety of optical members can be arranged on the outer surface of the substrate 452. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 452.

When the protective layer 121 covering the light-emitting element is provided, which prevents an impurity such as water from entering the light-emitting element. As a result, the reliability of the light-emitting element can be enhanced.

In the region 228 in the vicinity of the end portion of the display device 400A, the insulating layer 215 and the protective layer 121 are preferably in contact with each other through an opening in the insulating layer 214. In particular, the inorganic insulating film included in the insulating layer 215 and the inorganic insulating film included in the protective layer 121 are preferably in contact with each other. This can inhibit entry of impurities into the display portion 462 from the outside through the insulating layer 214 even when an organic insulating film is used as the insulating layer 214. Consequently, the reliability of the display device 400A can be enhanced.

For each of the substrates 451 and 452, glass, quartz, ceramic, sapphire, a resin, a metal, an alloy, a semiconductor or the like can be used. The substrate on the side from which light from the light-emitting element is extracted is formed using a material which transmits the light. When the substrates 451 and 452 are formed using a flexible material, the flexibility of the display device can be increased. Furthermore, a polarizing plate may be used as the substrate 451 or the substrate 452.

For each of the substrate 451 and the substrate 452, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer 442, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers functioning as wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display device, and conductive layers (e.g., a conductive layer functioning as a pixel electrode or a common electrode) included in a light-emitting element.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

In the case where any of the structures illustrated in FIGS. 7B to 7E is employed, the display device can have a structure in which the transistor 201 in the circuit 464 does not overlap with the common layer 114.

FIGS. 12B and 12C each illustrate a structure example of a transistor different from that in FIG. 12A.

In FIG. 12B, a transistor 202 includes the conductive layer 221 functioning as a gate, the insulating layer 211 functioning as a gate insulating layer, a semiconductor layer 231 including a channel formation region 231$i$ and a pair of low-resistance regions 231$n$, the conductive layer 222$a$ connected to one of the low-resistance regions 231$n$, the conductive layer 222$b$ connected to the other low-resistance region 231$n$, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231$i$. The insulating layer 225 is positioned between the conductive layer 223 and the channel formation region 231$i$.

The conductive layer 222$a$ and the conductive layer 222$b$ are each connected to the corresponding low-resistance region 231$n$ through openings provided in the insulating layer 225 and the insulating layer 215. One of the conductive layers 222$a$ and 222$b$ serves as a source, and the other serves as a drain of the transistor 202.

FIG. 12B illustrates an example in which the insulating layer 225 covers a top and side surfaces of the semiconductor layer 231. The conductive layer 222a and the conductive layer 222b are each connected to the corresponding low-resistance region 231n through openings provided in the insulating layer 225 and the insulating layer 215. Furthermore, an insulating layer 218 covering the transistor 202 may be provided.

In a transistor 209 illustrated in FIG. 12C, the insulating layer 225 overlaps with the channel formation region 231i of the semiconductor layer 231 and does not overlap with the low-resistance regions 231n. The structure illustrated in FIG. 12C is obtained by processing the insulating layer 225 with the conductive layer 223 as a mask, for example. In FIG. 12C, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor 209 may be provided.

[Display Device 400B-1]

Figure 13:
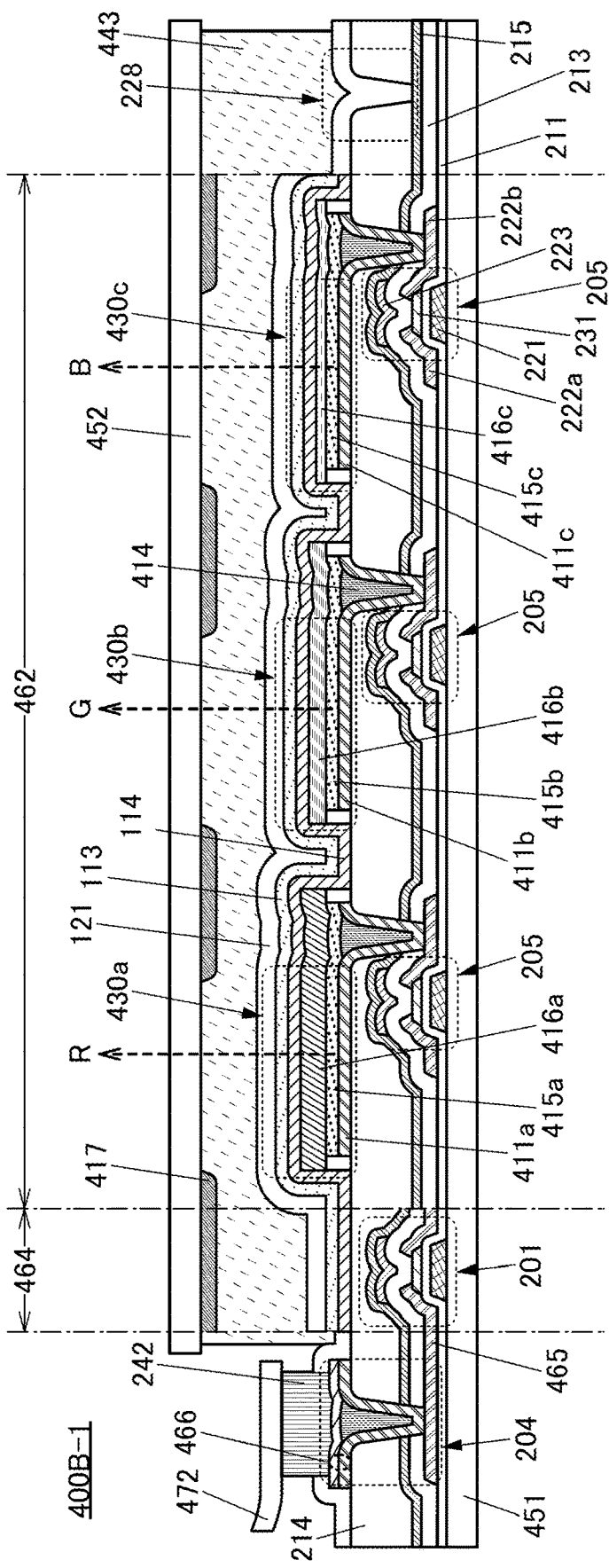
FIG. 13 is a cross-sectional view illustrating an example of a display device.

FIG. 13 illustrates a structure example of a display device 400B-1. The display device 400B-1 includes optical adjustment layers 415a to 415c, and the EL layers 416a to 416c with different thicknesses depending on emitted colors. Specifically, the structure described in Embodiment 1 or the like can be used.

In addition, as illustrated in FIG. 13, a layer 414 may be provided in openings provided in the insulating layer 214 to be over the pixel electrodes 411a, 411b, and 411c. With the layer 414, unevenness of surfaces where the optical adjustment layer 415a, the optical adjustment layer 415b, the optical adjustment layer 415c, the EL layer 416a, the EL layer 416b, and the EL layer 416c are formed can be reduced, and coverage can be improved. The layer 414 can also be provided in the region including the FPC 472. The layer 414 preferably has an insulating property. Alternatively, the layer 414 may be a conductive layer. Note that it is possible to employ a structure where the layer 414 is provided in the pixel portion but not provided in the connection portion or a structure where the layer 414 is provided in the connection portion but not provided in the pixel portion.

FIG. 13 shows a solid sealing structure in which an adhesive layer is provided in the region 443. For the other components, the structures illustrated in FIG. 12A to 12C or the like may be employed as appropriate.

[Display Device 400B-2]

Figure 14:
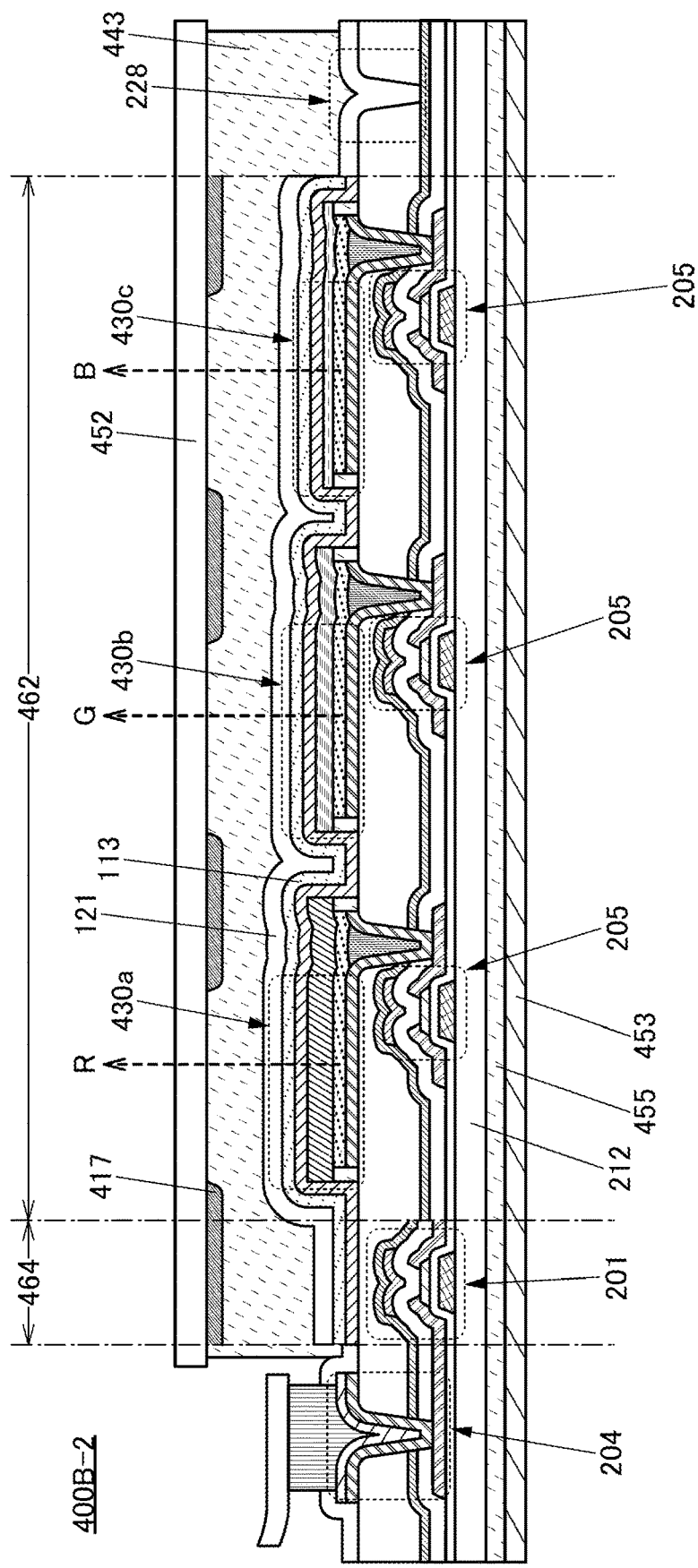
FIG. 14 is a cross-sectional view illustrating an example of a display device.

FIG. 14 illustrates a structure example of a display device 400B-2. The display device 400B-2 has a structure where a substrate 453 and an insulating layer 212 are bonded to each other with an adhesive layer 455.

As a method for manufacturing the display device 400B-2, first, a formation substrate (not illustrated) is bonded to the substrate 452 provided with the light-blocking layer 417 are bonded to each other in region 443 with an adhesive layer. Here, the formation substrate is provided with the insulating layer 212, the transistors 201 and 205, the light-emitting elements 430a to 430c, and the like. Then, the substrate 453 is attached to a surface exposed by separation of the formation substrate with use of the adhesive layer 455, whereby the components formed over the formation substrate are transferred onto the substrate 453. The substrate 453 and the substrate 452 are preferably flexible. Accordingly, the display device 400B-2 can be highly flexible.

The display device 400B-2 of one embodiment of the present invention can have a structure in which no partition layer is provided in a region between the light-emitting elements or a region above the driver circuit; thus, folding at the region can be facilitated. Such a region is preferably provided to overlap with a foldable region in the display device 400B-2. For the other components, the structures illustrated in FIG. 12A to 12C or the like can be employed as appropriate.

At least part of any of the structures, the structure examples, the manufacturing method examples, the drawings corresponding thereto, and the like described in this embodiment can be implemented in combination with any of the other structures, the other structure examples, the other manufacturing method examples, the other drawings corresponding thereto, and the like as appropriate.

Embodiment 3

In this embodiment, a structure example of a display device different from the above will be described.

The display device in this embodiment can be a high-resolution display device. Thus, the display device in this embodiment can be used for display portions of information terminals (wearable devices) such as watch-type or bracelet-type information terminals and display portions of wearable devices capable of being worn on a head, such as a VR device such as a head mounted display and a glasses-type AR device.

[Display Module]

Figure 15A:
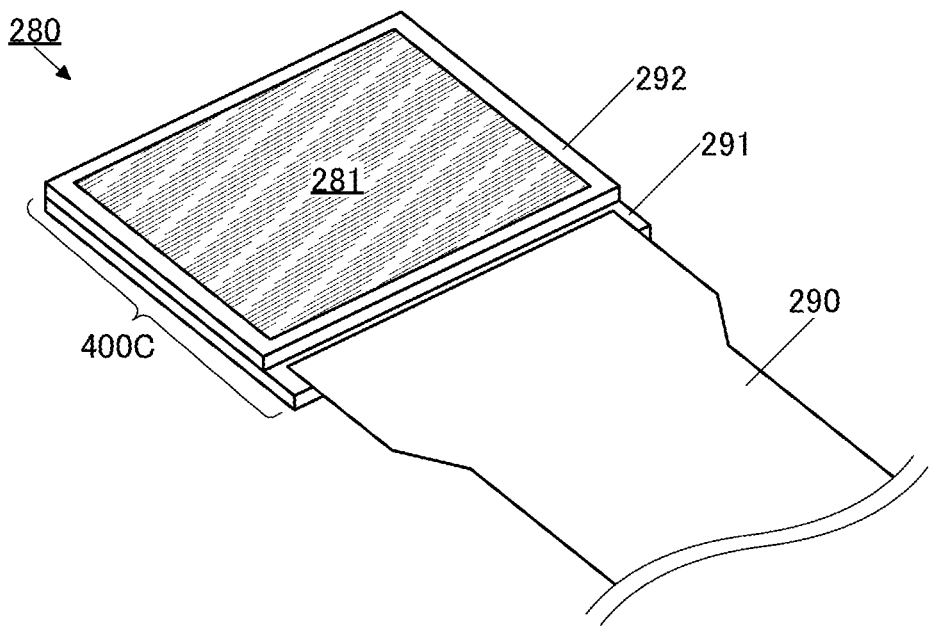
FIGS. 15A and 15B are perspective views illustrating an example of a display module.

FIG. 15A is a perspective view of a display module 280. The display module 280 includes the display device 400C and an FPC 290. Note that as a display device included in the display module 280, the display device 100A, the display device 100B, and the display devices 400A to 400E, which are disclosed in this specification, can be used as appropriate.

The display module 280 includes a substrate 291 and a substrate 292. The display module 280 includes a display portion 281. The display portion 281 is a region of the display module 280 where an image is displayed and is a region where light emitted from pixels provided in a pixel portion 284 described later can be seen.

Figure 15B:
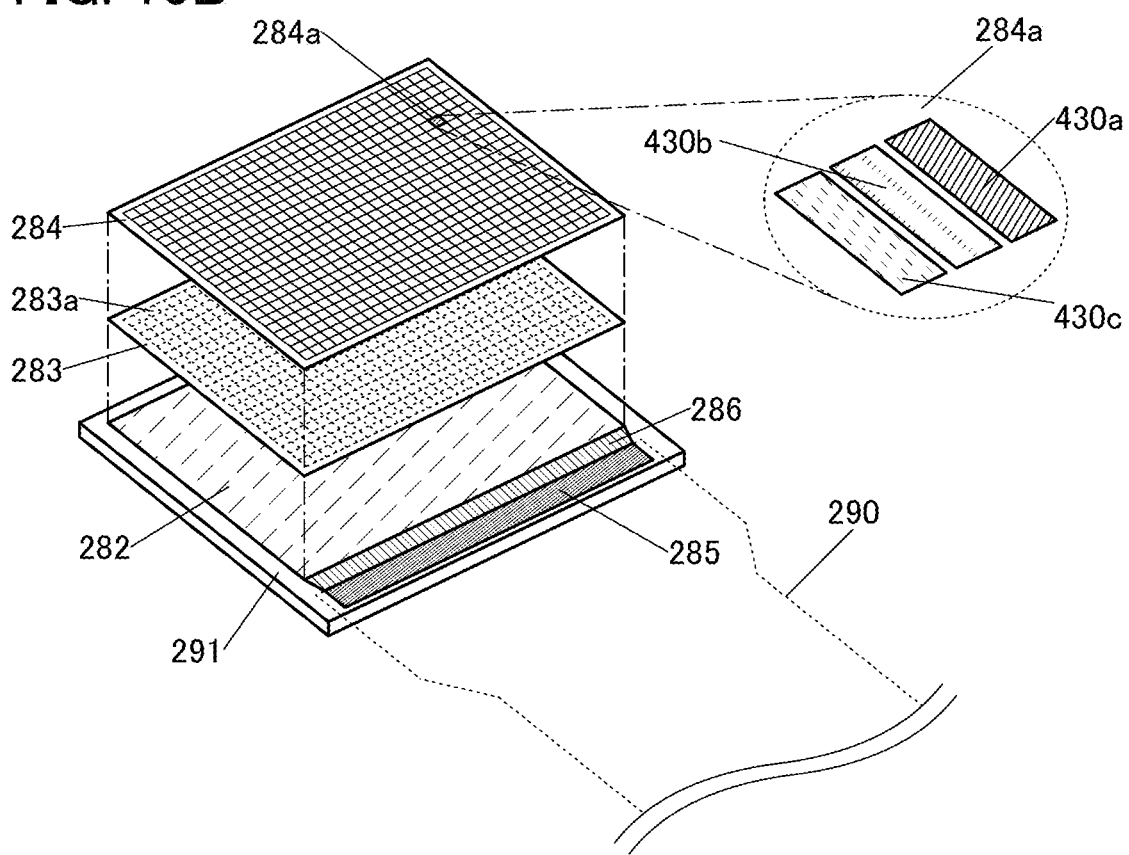

FIG. 15B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 15B. The pixel 284a includes the light-emitting elements 430a, 430b, and 430c whose emission colors are different from each other. The plurality of light-emitting elements are preferably arranged in a stripe pattern as illustrated in FIG. 15B. Arrangement in a stripe pattern enables the light-emitting elements of one embodiment of the present invention to be arranged densely over the pixel circuit; thus, a high-resolution display device can be provided. Alternatively, a variety of kinds of patterns such as a delta pattern or a pentile pattern can be employed.

The pixel circuit portion 283 includes a plurality of pixel circuits 283a arranged periodically.

One pixel circuit 283a is a circuit that controls light emission from three light-emitting elements included in one pixel 284a. One pixel circuit 283a may be provided with three circuits each of which controls light emission of one light-emitting element. For example, the pixel circuit 283a can include at least one selection transistor, one current control transistor (driving transistor), and a capacitor for one light-emitting element. A gate signal is input to a gate of the selection transistor, and a source signal is input to one of a source and a drain of the selection transistor. With such a structure, an active-matrix display device is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 serves as a wiring for supplying a video signal or a power supply potential to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, and further preferably greater than or equal to 60% and less than or equal to 95%. Furthermore, the pixels 284a can be arranged extremely densely and thus the display portion 281 can have greatly high resolution. For example, the pixels 284a are preferably arranged in the display portion 281 with a resolution greater than or equal to 2000 ppi, preferably greater than or equal to 3000 ppi, further preferably greater than or equal to 5000 ppi, further more preferably greater than or equal to 6000 ppi, and less than or equal to 20000 ppi or less than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Device 400C]

Figure 16:
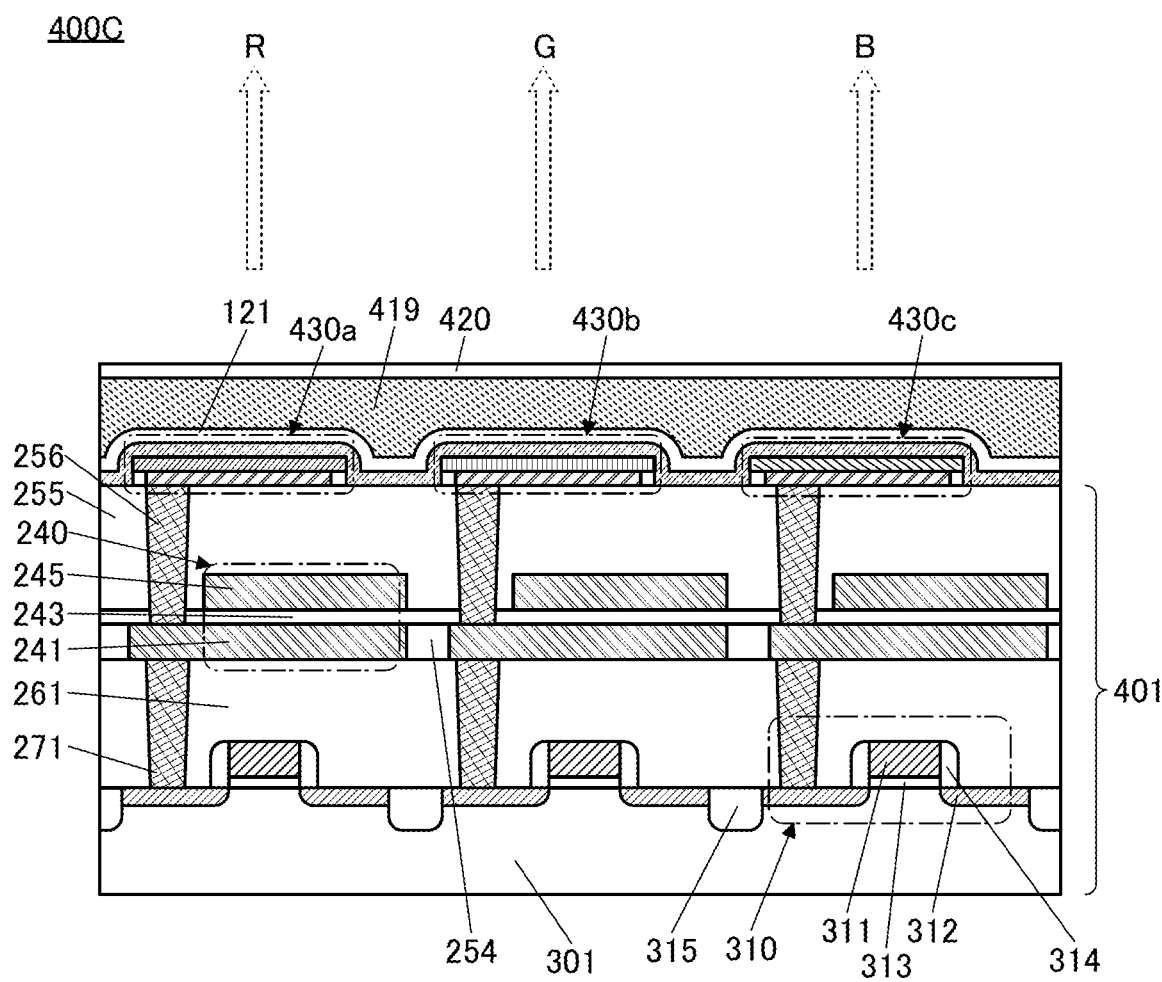
FIG. 16 is a cross-sectional view illustrating an example of a display device.

The display device 400C illustrated in FIG. 16 includes a substrate 301, the light-emitting elements 430a, 430b, and 430c, a capacitor 240, and a transistor 310.

The substrate 301 corresponds to the substrate 291 illustrated in FIGS. 15A and 15B. A stacked structure (layer 401) including the substrate 301 and the components thereover (up to an insulating layer 255) corresponds to the substrate 101 in Embodiment 1.

The transistor 310 is a transistor whose channel formation region is in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311 and functions as an insulating layer.

An element isolation layer 315 is provided between two adjacent transistors 310 to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting element 430a, the light-emitting element 430b, the light-emitting element 430c, and the like are provided over the insulating layer 255. The protective layer 121 is provided over the light-emitting elements 430a, 430b, and 430c, and a substrate 420 is bonded to a top surface of the protective layer 121 with a resin layer 419. The substrate 420 corresponds to the substrate 292 in FIG. 15A.

The pixel electrode of the light-emitting element is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Device 400D]

Figure 17:
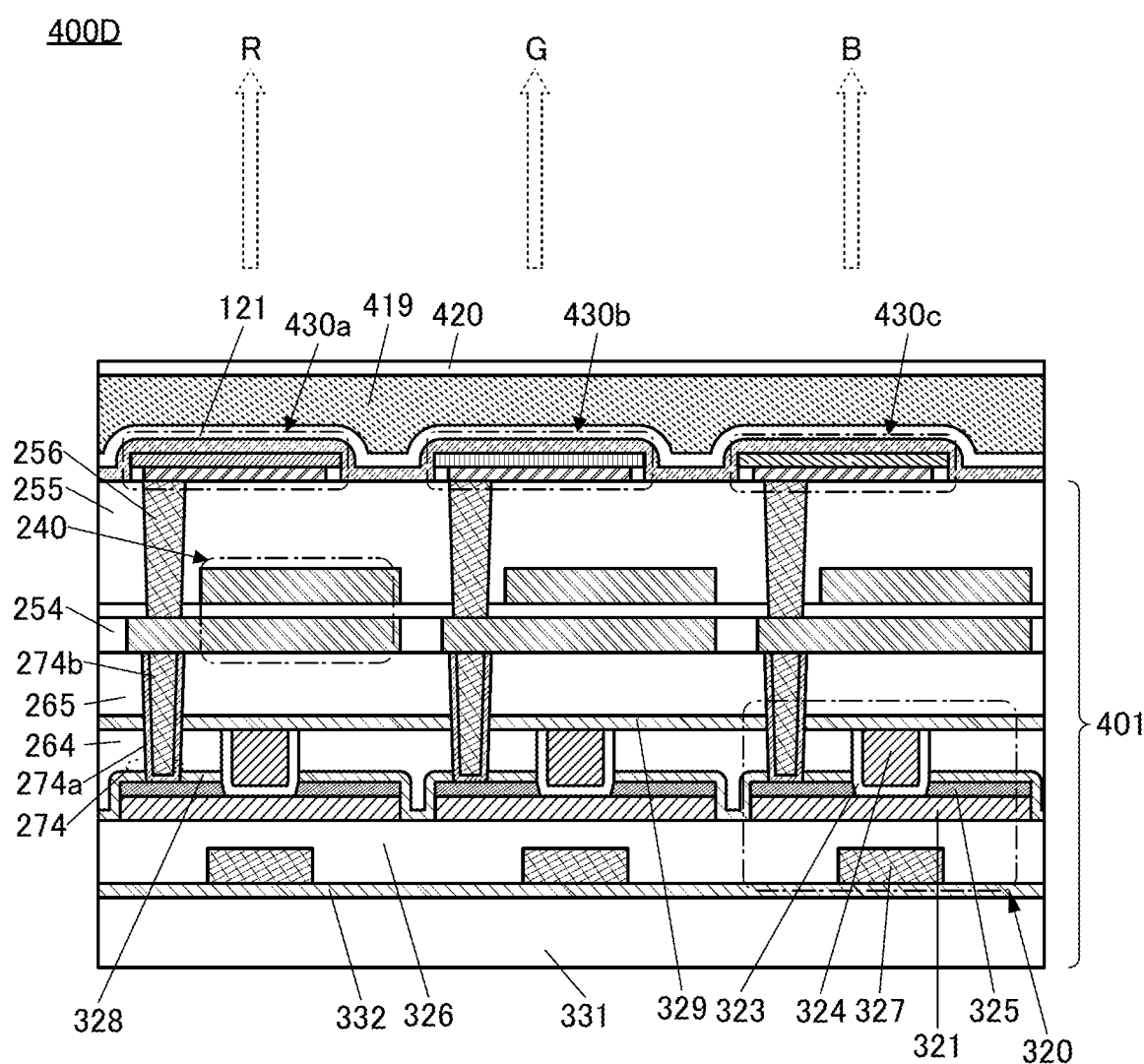
FIG. 17 is a cross-sectional view illustrating an example of a display device.

A display device 400D illustrated in FIG. 17 is different from the display device 400C mainly in a structure of the transistor. Note that portions similar to those in the display device 400C are not be described in some cases.

A transistor 320 contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIGS. 15A and 15B. A stacked structure (layer 401) including the substrate 331 and the components thereover (up to the insulating layer 255) corresponds to the substrate 101 in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 side into the transistor 320 and release of oxygen from the semiconductor layer 321 to the substrate 331 side. As the insulating layer 332, for example, a film in which hydrogen or oxygen is less likely to diffuse than in a silicon oxide film can be used. Examples of such a silicon oxide film include an aluminum oxide film, a hafnium oxide film, and a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. In addition, the top surface of the insulating layer 326 is preferably planarized.

The insulating layer 326 is provided over the semiconductor layer 321. A metal oxide film having semiconductor characteristics (also referred to as an oxide semiconductor film) is preferably used as the semiconductor layer 321. A material that can be used for the semiconductor layer 321 is described in detail later.

The pair of conductive layers 325 is provided on and in contact with the semiconductor layer 321, and functions as a source electrode and a drain electrode of the transistor 320.

An insulating layer 328 is provided to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the interlayer insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. In the opening, the insulating layer 323 is provided to be in contact with side surfaces of the insulating layer 264, the insulating layer 328, and the conductive layer 325 and in contact with a top surface of the semiconductor layer 321, and the conductive layer 324 is provided over the insulating layer 323 so as to fill the opening. The conductive layer 324 functions as a second gate electrode of the transistor 320, and the insulating layer 323 functions as a second gate insulating layer.

The top surface of the conductive layer 324, the top surface of the insulating layer 323, and the top surface of the insulating layer 264 are planarized so that they are substantially level with each other, and insulating layers 329 and 265 are provided to cover these layers.

The insulating layers 264 and 265 each function as an interlayer insulating layer. The insulating layer 329 functions as a barrier layer that prevents diffusion of impurities such as water or hydrogen from the insulating layer 265 or the like to the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274a that covers side surfaces of openings formed in the insulating layers 265, 329, 264, and 328 and part of a top surface of the conductive layer 325, and a conductive layer 274b in contact with a top surface of the conductive layer 274a. As the conductive layer 274a, a conductive material in which hydrogen and oxygen are less likely to be diffused is preferably used.

The structure of the insulating layer 254 and the components thereover (up to the substrate 420) in the display device 400D is similar to that of the display device 400C.

[Display Device 400E]

Figure 18:
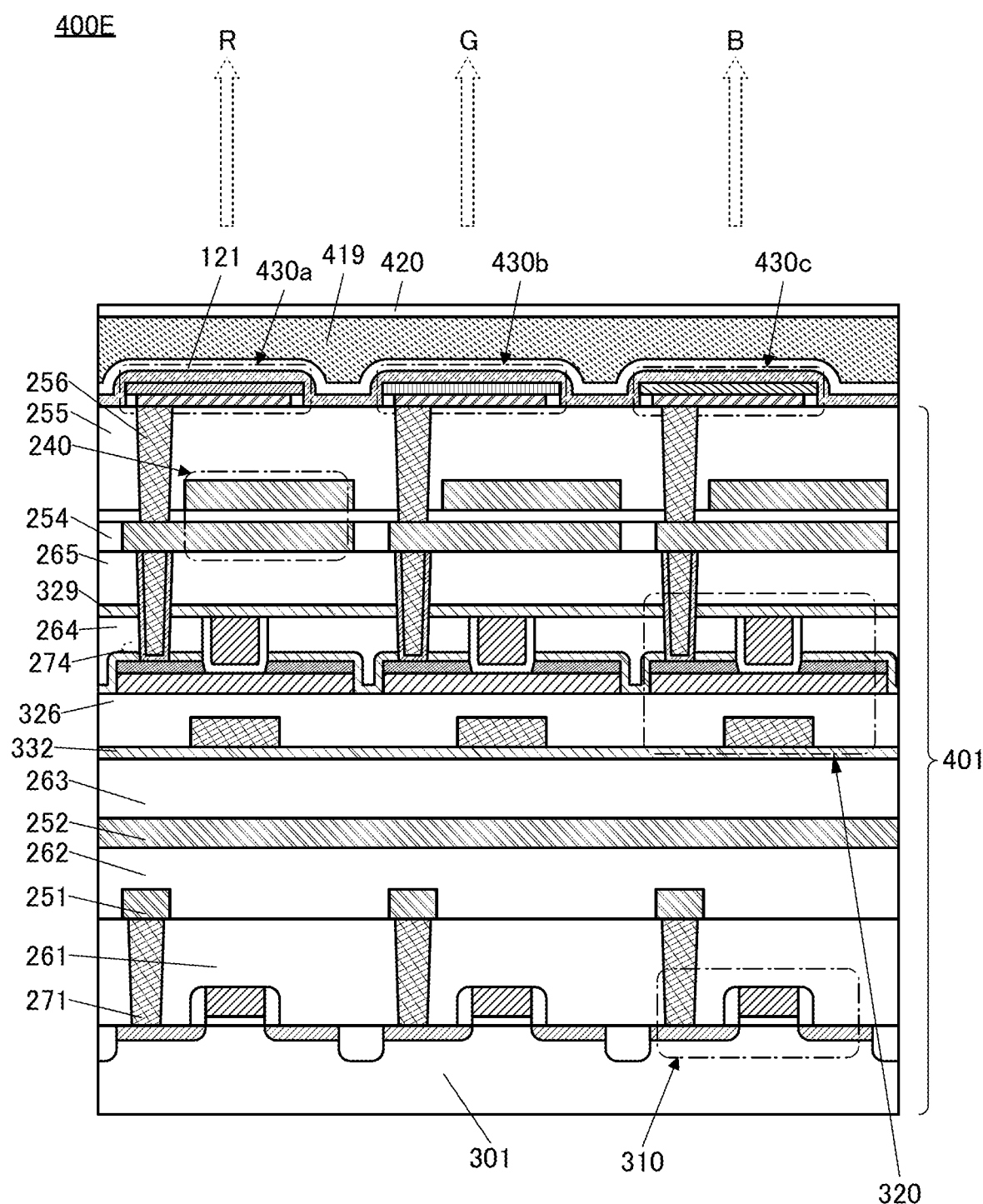
FIG. 18 is a cross-sectional view illustrating an example of a display device.

A display device 400E illustrated in FIG. 18 has a structure in which the transistor 310 whose channel is formed in the substrate 301 and the transistor 320 including a metal oxide in the semiconductor layer where the channel is formed are stacked. Note that portions similar to those of the display devices 400C and 400D are not described in some cases.

The insulating layer 261 is provided to cover the transistor 310, and a conductive layer 251 is provided over the insulating layer 261. The insulating layer 262 is provided so as to cover the conductive layer 251, and a conductive layer 252 is provided over the insulating layer 262. The conductive layers 251 and 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (one or both of a gate driver and a source driver) for driving the pixel circuit. The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting element; thus, the display device can be downsized as compared with the case where the driver circuit is provided around a display portion.

At least part of any of the structure examples, the drawings corresponding thereto, and the like described in this embodiment can be implemented in combination with any of the other structure examples, the other drawings corresponding thereto, and the like as appropriate.

Embodiment 4

In this embodiment, a light-emitting element (also referred to as light-emitting device) that can be used in the display device of one embodiment of the present invention will be described.

<Structure Example of Light-Emitting Element>

Figure 19A:
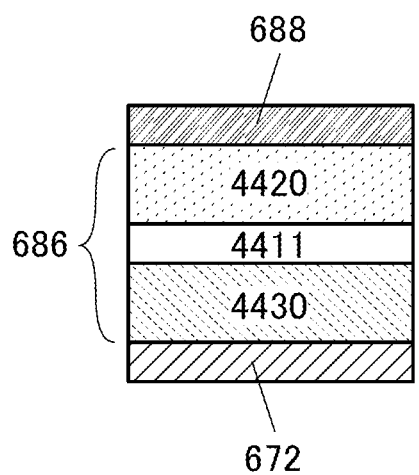
FIGS. 19A to 19D each illustrate a structure example of a light-emitting element.

As illustrated in FIG. 19A, the light-emitting element includes an EL layer 686 between a pair of electrodes (a lower electrode 672 and an upper electrode 688). The EL layer 686 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 19A is referred to as a single structure in this specification.

Figure 19B:
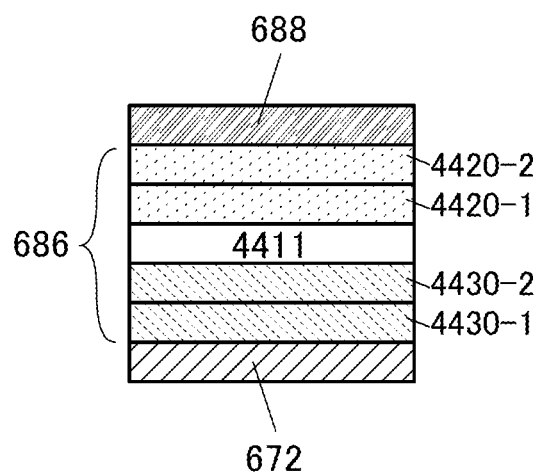

FIG. 19B is a modification example of the EL layer 686 included in the light-emitting element illustrated in FIG. 19A. Specifically, the light-emitting element illustrated in FIG. 19B includes a layer 4430-1 over the lower electrode 672, a layer 4430-2 over the layer 4430-1, the light-emitting layer 4411 over the layer 4430-2, the layer 4420-1 over the light-emitting layer 4411, the layer 4420-2 over the layer 4420-1, and the upper electrode 688 over the layer 4420-2. For example, when the lower electrode 672 functions as an anode and the upper electrode 688 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 672 functions as a cathode and the upper electrode 688 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layered structure, carriers can be efficiently injected to the light-emitting layer 4411, and the efficiency of the recombination of carriers in the light-emitting layer 4411 can be enhanced.

Figure 19C:
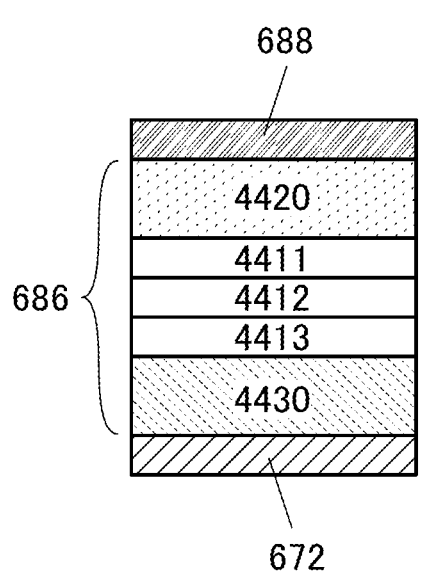

Note that the structure in which a plurality of light-emitting layers (light-emitting layers 4411, 4412, and 4413) is provided between the layer 4420 and the layer 4430 as illustrated in FIG. 19C is another variation of the single structure.

Figure 19D:
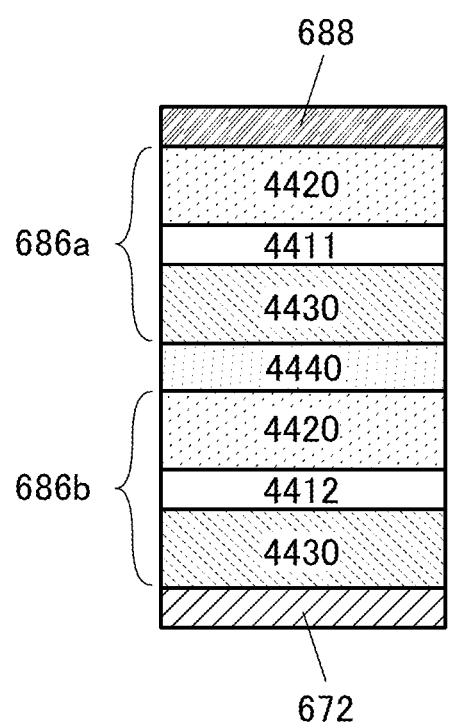

The structure in which a plurality of light-emitting units (EL layers 686a and 686b) is connected in series with an intermediate layer (charge-generation layer) 4440 therebetween as illustrated in FIG. 19D is referred to as a tandem structure in this specification. In this specification and the like, the structure illustrated in FIG. 19D is referred to as a tandem structure; however, without being limited to this, a tandem structure may be referred to as a stack structure, for example. The tandem structure enables a light-emitting element capable of high luminance light emission.

Each of the structures illustrated FIGS. 19C and 19D may have a stacked structure in which each of the layer 4420 and the layer 4430 is formed with two or more layers as in the case of FIG. 19B.

When the above single structure, the above tandem structure, and an SBS structure are compared in terms of the amount of power consumption, the ascending order is the SBS structure, the tandem structure, and the single structure. To reduce power consumption, the SBS structure is preferably used. Meanwhile, the single structure and the tandem structure are preferable in terms of lower manufacturing cost or higher manufacturing yield because the manufacturing processes of the single structure and the tandem structure are simpler than that of the SBS structure.

The emission color of the light-emitting element can be changed to red, green, blue, cyan, magenta, yellow, white, or the like depending on the material of the EL layer 686. When the light-emitting element has a microcavity structure, the color purity can be further increased.

In the light-emitting element that emits white light, the light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that the light-emitting element can emit white light as a whole. This can be applied to a light-emitting element including three or more light-emitting layers.

The light-emitting layer preferably contains two or more selected from light-emitting substances that emit light of red (R), green (G), blue (B), yellow (Y), orange (O), and the like. A light-emitting substance that emits light of violet, bluish violet, yellowish blue, near infrared, and the like may be included. Alternatively, the light-emitting layer preferably contains two or more light-emitting substances that emit light containing two or more of spectral components of R, G, and B.

At least part of any of the structure examples, the drawings corresponding thereto, and the like described in this embodiment can be implemented in combination with any of the other structure examples, the other drawings corresponding thereto, and the like as appropriate.

Embodiment 5

Described in this embodiment is a metal oxide (also referred to as an oxide semiconductor) applicable to an OS transistor described in the above embodiment.

A metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a CVD method such as an MOCVD method, an ALD method, or the like.

<Classification of Crystal Structure>

Amorphous (including a completely amorphous structure), c-axis-aligned crystalline (CAAC), nanocrystalline (nc), cloud-aligned composite (CAC), single-crystal, and polycrystalline structures can be given as examples of a crystal structure of an oxide semiconductor.

A crystal structure of a film or a substrate can be analyzed with an X-ray diffraction (XRD) spectrum. For example, evaluation is possible using an XRD spectrum which is obtained by grazing-incidence XRD (GIXD) measurement. Note that a GIRD method is also referred to as a thin film method or a Seemann-Bohlin method.

For example, the peak of the XRD spectrum of the quartz glass substrate has a bilaterally symmetrical shape. On the other hand, the peak of the XRD spectrum of the IGZO film having a crystal structure has a bilaterally asymmetrical shape. The bilaterally asymmetrical peak shows the existence of crystal in the film or the substrate. In other words, the crystal structure of the film or the substrate cannot be regarded as "amorphous" unless it has a bilaterally symmetrical peak in the XRD spectrum.

The crystal structure of a film or a substrate can be analyzed with a diffraction pattern obtained by nanobeam electron diffraction (NBED) (also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

<<Oxide Semiconductor Structure>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using $\theta/2\theta$ scanning, for example, a peak indicating c-axis alignment is detected at or around $2\theta=31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are symmetric with respect to a spot of the incident electron beam which passes through a sample (also referred to as a direct spot).

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using $\theta/2\theta$ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Component of Oxide Semiconductor>>

Next, the CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more types of metal elements are unevenly distributed and regions including the metal element(s) are mixed is referred to as a mosaic pattern or a patch-like pattern.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Here, the atomic ratios of In, Ga, and Zn to a metal element included in a CAC-OS in an In—Ga—Zn oxide are expressed as [In], [Ga], and [Zn], respectively. For example, the first region in the CAC-OS in the In—Ga—Zn oxide has [In] higher than that in the composition of the CAC-OS film. Moreover, the second region of the CAC-OS in the In—Ga—Zn oxide has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of film formation is preferably as low as possible, and for example, the flow ratio of an oxygen gas is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a composition in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (on/off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current ($I_{on}$), a high field-effect mobility ($\mu$), low leakage current, and favorable switching operation can be achieved.

A transistor including a CAC-OS is highly reliable. Thus, the CAC-OS is suitably used in a variety of semiconductor devices typified by a display device.

An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

An oxide semiconductor containing nitrogen easily becomes n-type by generation of electrons serving as carriers and an increase in carrier concentration. Thus, a transistor using an oxide semiconductor that contains nitrogen is likely to be normally on. When nitrogen is contained in the oxide semiconductor, a trap state is sometimes formed. This might make the electrical characteristics of the transistor unstable. Thus, the concentration of nitrogen in the channel formation region using the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

At least part of this embodiment can be implemented in appropriate combination with any of the other embodiments described in this specification.

Embodiment 6

In this embodiment, electronic devices of one embodiment of the present invention will be described with reference to FIGS. 20A and 20B, 21A to 21D, 22A to 22F, and 23A to 23F.

An electronic device in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, a display device of one embodiment of the present invention can have a high resolution, and thus can be favorably used for an electronic device having a relatively small display portion. As such an electronic device, a watch-type or bracelet-type information terminal device (wearable device); and a wearable device worn on a head, such as a device for VR such as a head mounted display and a glasses-type device for AR can be given, for example. Examples of wearable devices includes a device for substitution reality (SR) and a device for mixed reality (MR).

The resolution of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, resolution of 4K2K, 8K4K, or higher is preferable. Furthermore, the pixel density (definition) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display device with high resolution and high definition, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 20A:
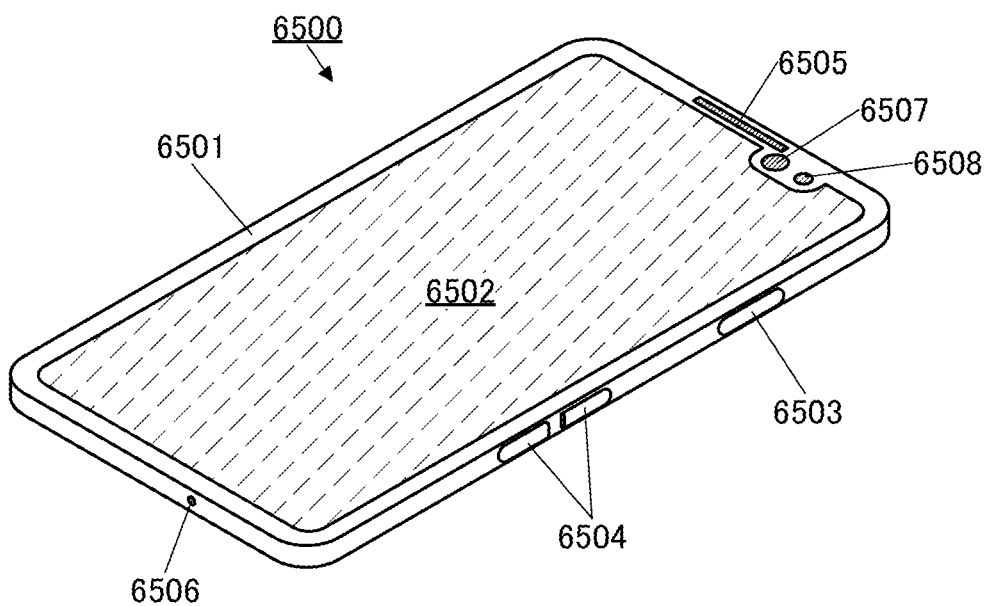
FIGS. 20A and 20B illustrate an example of an electronic device.

An electronic device 6500 in FIG. 20A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 20B:
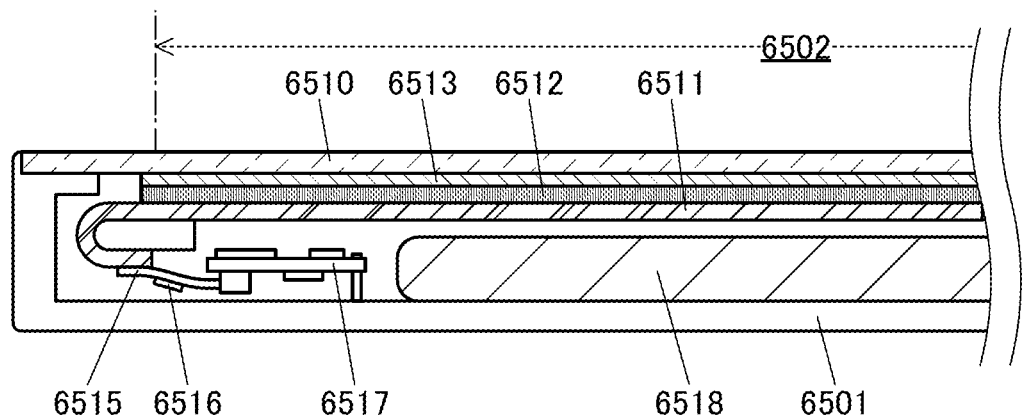

FIG. 20B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while h the thickness of the electronic device is controlled. Moreover, a part of the display panel 6511 is folded back so that a connection portion with the FPC 6515 is provided on the back side of the pixel portion, whereby an electronic device with a narrow bezel can be achieved.

Figure 21A:
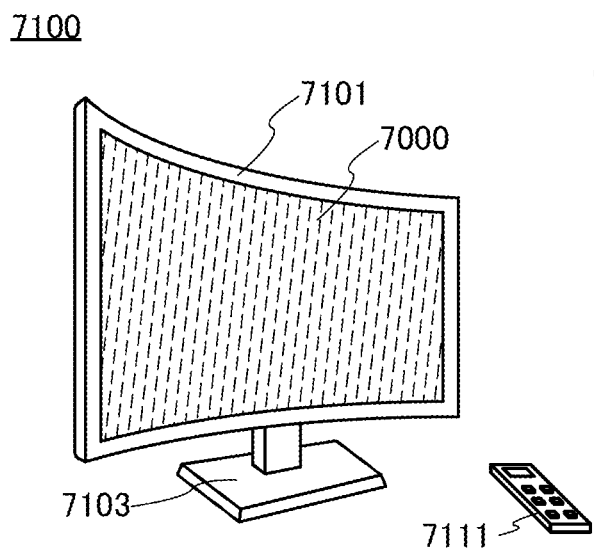
FIGS. 21A to 21D each illustrate an example of an electronic device.

FIG. 21A shows an example of a television device. In a television device 7100, a display portion 7000 is incorporated in a housing 7101. Here, the housing 7101 is supported by a stand 7103.

The display device of one embodiment of the present invention can be used for the display portion 7000.

Operation of the television device 7100 illustrated in FIG. 21A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 21B:
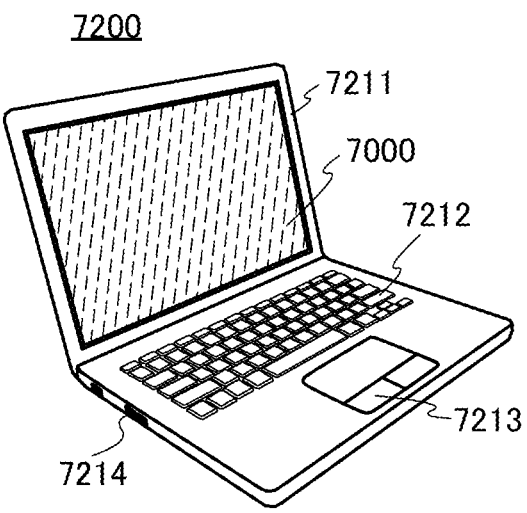

FIG. 21B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 21C:
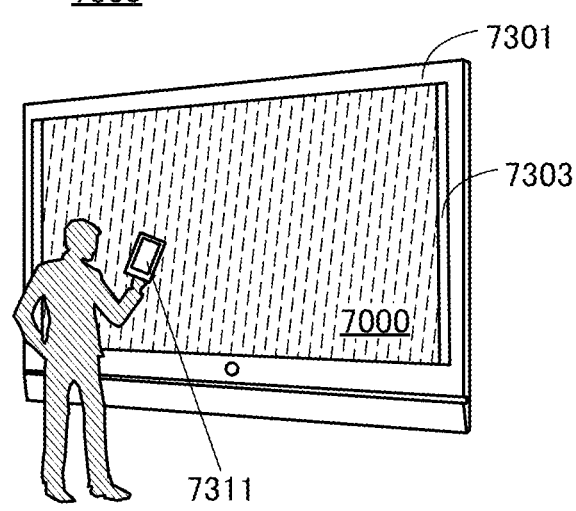
Figure 21D:
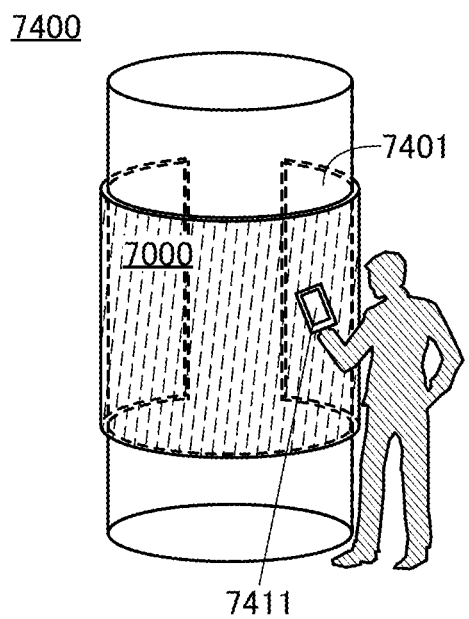

FIGS. 21C and 21D illustrate examples of digital signage.

Digital signage 7300 illustrated in FIG. 21C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 21D is digital signage 7400 attached to a cylindrical pillar 7401. The digital signage 7400 includes the display portion 7000 provided along a curved surface of the pillar 7401.

The display device of one embodiment of the present invention can be used in the display portion 7000 illustrated in each of FIGS. 21C and 21D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 21C and 21D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 22A:
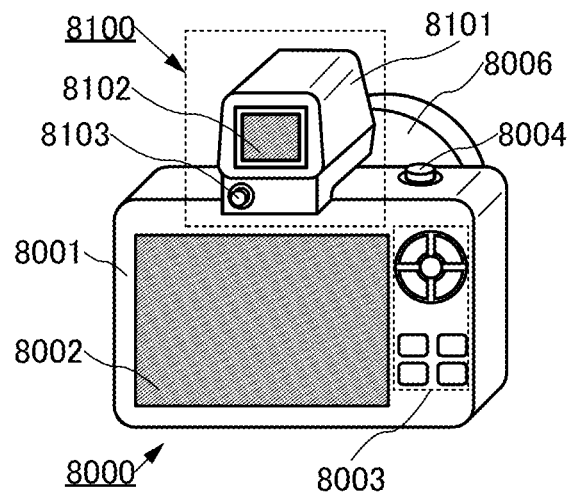
FIGS. 22A to 22F illustrate examples of electronic devices.

FIG. 22A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing 8001 may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power supply button or the like.

A display device of one embodiment of the present invention can be used in the display portion 8002 of the camera 8000 and the display portion 8102 of the finder 8100. Note that a finder may be incorporated in the camera 8000.

Figure 22B:
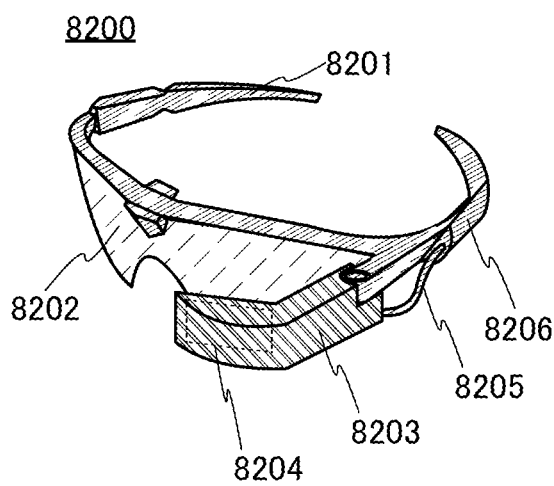

FIG. 22B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display device of one embodiment of the present invention can be used in the display portion 8204.

Figure 22C:
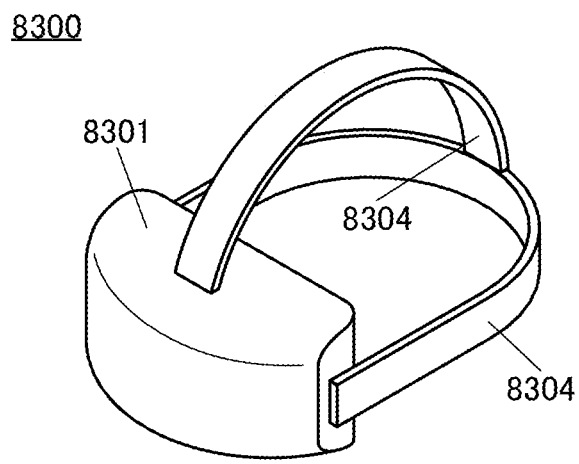
Figure 22D:
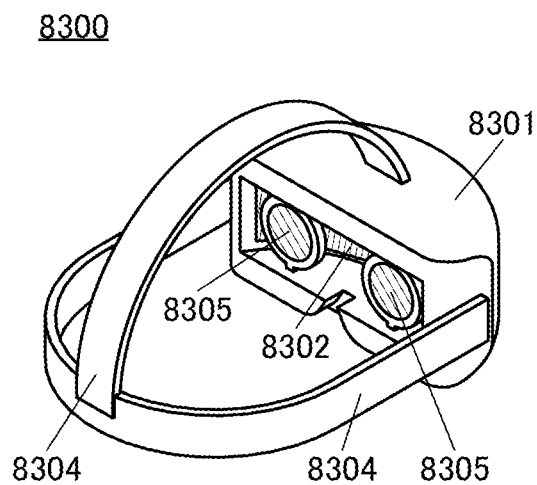
Figure 22E:
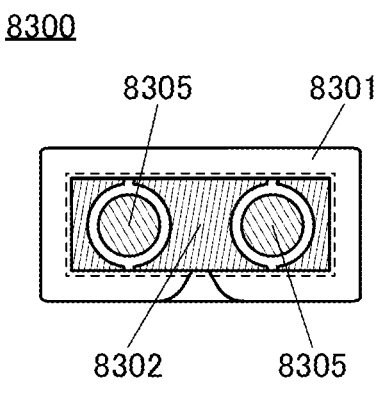

FIGS. 22C to 22E are external views of a head-mounted display 8300. The head-mounted display 8300 includes the housing 8301, the display portion 8302, the band-like fixing member 8304, and a pair of lenses 8305.

A user can see display on the display portion 8302 through the lenses 8305. The display portion 8302 is preferably curved because the user can feel high realistic sensation. Another image displayed in another region of the display portion 8302 is viewed through the lenses 8305, so that three-dimensional display using parallax or the like can be performed. Note that the number of the display portions 8302 is not limited to one; two display portions 8302 may be provided for user's respective eyes.

The display device of one embodiment of the present invention can be used for the display portion 8302. The display device of one embodiment of the present invention achieves extremely high resolution. For example, a pixel is not easily seen by the user even when the user sees display that is magnified by the use of the lenses 8305 as illustrated in FIG. 22E. In other words, a video with a strong sense of reality can be seen by the user with use of the display portion 8302.

Figure 22F:
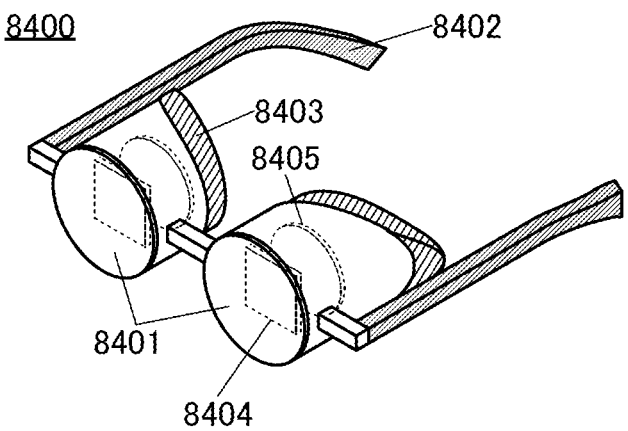

FIG. 22F is an external view of a google-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A display device of one embodiment of the present invention can be used in the display portion 8404.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy images and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIGS. 23A to 23F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 23A to 23F have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used for the display portion 9001.

The electronic devices in FIGS. 23A to 23F are described in detail below.

Figure 23A:
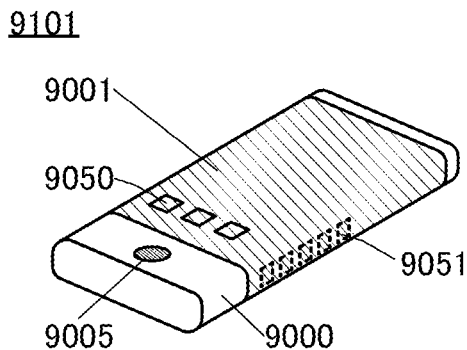
FIGS. 23A to 23F illustrate examples of electronic devices.

FIG. 23A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 23A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 23B:
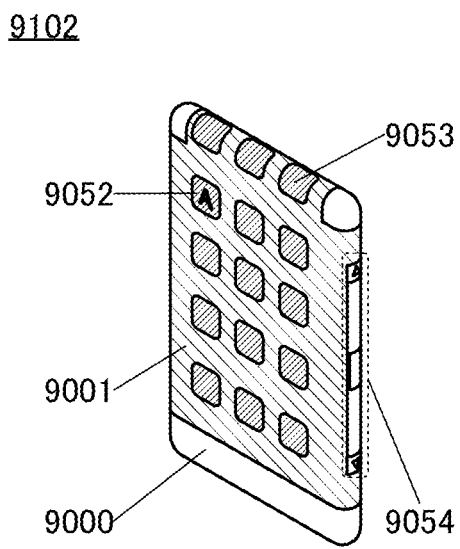

FIG. 23B is a perspective view showing a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 23C:
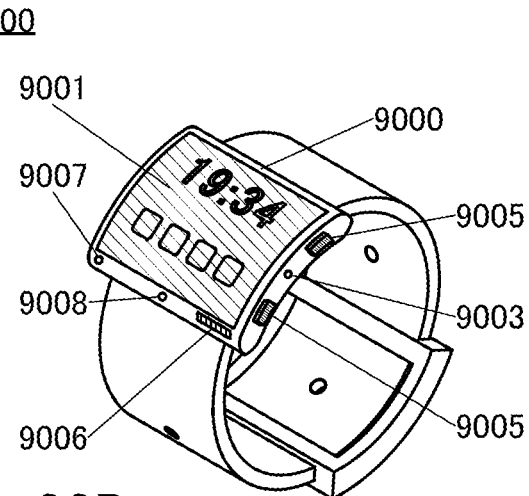

FIG. 23C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 23D:
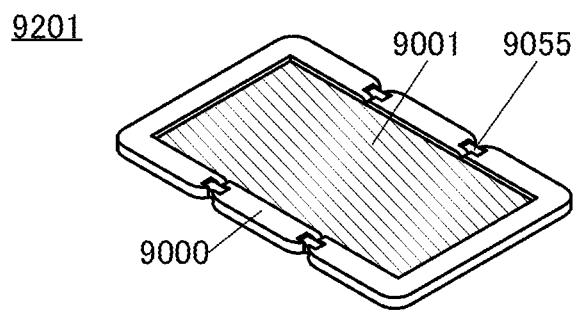
Figure 23E:
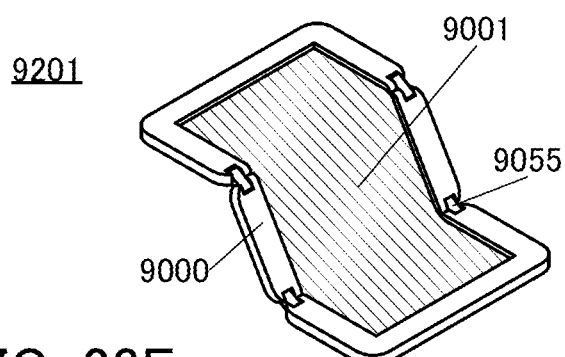
Figure 23F:
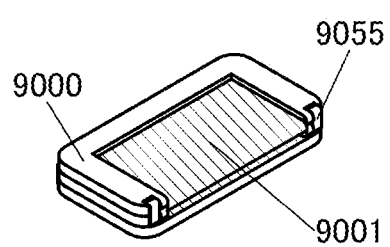

FIGS. 23D to 23F are perspective views illustrating a foldable portable information terminal 9201. FIG. 23D is a perspective view of an opened state of the portable information terminal 9201, FIG. 23F is a perspective view of a folded state thereof, and FIG. 23E is a perspective view of a state in the middle of change from one of FIG. 23D and FIG. 23F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of any of the structure examples, the drawings corresponding thereto, and the like described in this embodiment can be implemented in combination with any of the other structure examples, the other drawings corresponding thereto, and the like as appropriate.

This application is based on Japanese Patent Application Serial No. 2021-011450 filed with Japan Patent Office on Jan. 27, 2021, the entire contents of which are hereby incorporated by reference.

What is claimed is:

1. A display device comprising:
a first lower electrode;
a first EL layer over the first lower electrode;
a second lower electrode;
a second EL layer over the second lower electrode;
an upper electrode over the first EL layer and the second EL layer;
a first region below the first EL layer; and
a second region below the second EL layer,
wherein in the first region, the first lower electrode is not provided, and the upper electrode is positioned not to be in contact with the first lower electrode, and
wherein in the second region, the second lower electrode is not provided, and the upper electrode is positioned not to be in contact with the second lower electrode.

2. The display device according to claim 1, wherein the upper electrode comprises a region overlapping with the first EL layer in the first region.

3. The display device according to claim 1, further comprising a common layer between the first EL layer and the upper electrode and between the second EL layer and the upper electrode.

4. A display device comprising:
a first lower electrode;
a first EL layer over the first lower electrode;
a second lower electrode;
a second EL layer over the second lower electrode; and
an upper electrode over the first EL layer and the second EL layer,
wherein the upper electrode is positioned to be apart from the first lower electrode in a first region below the first EL layer, and
wherein the upper electrode is positioned to be apart from the second lower electrode in a second region below the second EL layer.

5. A display device comprising:
a lower electrode;
an EL layer over the lower electrode; and
an upper electrode over the EL layer,
wherein the upper electrode is positioned to be apart from the lower electrode in a region below the EL layer.

6. The display device according to claim 4, wherein the upper electrode comprises a region overlapping with the first EL layer in the first region.

7. The display device according to claim 4, further comprising a common layer between the first EL layer and the upper electrode and between the second EL layer and the upper electrode.

* * * * *